US012802739B2

(12) United States Patent
Xie et al.

(10) Patent No.: US 12,802,739 B2
(45) Date of Patent: Nov. 17, 2026

(54) CLOCK SIGNAL GENERATION CIRCUIT AND METHOD, AND MEMORY

(71) Applicant: CXMT Corporation, Hefei City (CN)

(72) Inventors: Yanpeng Xie, Hefei City (CN); Zequn Huang, Hefei City (CN); Kai Dai, Hefei City (CN); Dong Hu, Hefei City (CN)

(73) Assignee: CXMT Corporation, Hefei City (CN)

( * ) Notice: Subject to any disclaimer, the term of this patent is extended or adjusted under 35 U.S.C. 154(b) by 67 days.

(21) Appl. No.: 18/923,615

(22) Filed: Oct. 22, 2024

(65) Prior Publication Data

US 2025/0046360 A1 Feb. 6, 2025

Related U.S. Application Data

(63) Continuation of application No. PCT/CN2024/095229, filed on May 24, 2024.

(30) Foreign Application Priority Data

Jul. 19, 2023 (CN) ........................ 202310887357.5

(51) Int. Cl.
*G11C 11/4076* (2006.01)
*G11C 11/4093* (2006.01)
*G11C 11/4096* (2006.01)

(52) U.S. Cl.
CPC ...... *G11C 11/4076* (2013.01); *G11C 11/4093* (2013.01); *G11C 11/4096* (2013.01)

(58) Field of Classification Search
CPC ............ G11C 11/4076; G11C 11/4093; G11C 11/4096; G11C 7/1072; G11C 7/222
See application file for complete search history.

(56) References Cited

U.S. PATENT DOCUMENTS 11,211,103 B1 12/2021 Mazumder et al.

FOREIGN PATENT DOCUMENTS

JP 2003256066 A * 9/2003

OTHER PUBLICATIONS

EESR in application No. EP 24 84 2062, mailed on Aug. 26, 2026.

* cited by examiner

*Primary Examiner* — Alfredo Bermudez Lozada

(57) ABSTRACT

A clock signal generation circuit includes: a command predecoding circuit, configured to decode partial command bits in a command, to obtain a predecoded command signal; a command decoding circuit, configured to decode the command, to obtain an internal command signal; a counter circuit, configured to count a clock cycle based on an initial clock signal, to generate a first counting signal and a second counting signal; and a clock signal interception circuit, connected to the command predecoding circuit, the command decoding circuit, and the counter circuit, and configured to intercept the initial clock signal based on the predecoded command signal, the internal command signal, the first counting signal, and the second counting signal, to obtain a target clock signal. A dynamic loss of the memory can be reduced.

15 Claims, 12 Drawing Sheets

CLOCK SIGNAL GENERATION CIRCUIT AND METHOD, AND MEMORY

CROSS-REFERENCE TO RELATED APPLICATIONS

This is a continuation of International Patent Application No. PCT/CN2024/095229 filed on May 24, 2024, which claims priority to Chinese Patent Application No. 202310887357.5 filed on Jul. 19, 2023. The disclosures of the above-referenced applications are hereby incorporated by reference in their entirety.

BACKGROUND

With continuous development of semiconductor technologies, memory technologies become an important research direction. Memories such as a dynamic random access memory (DRAM) usually need to perform various functions according to a command transmitted by a storage controller.

However, dynamic power consumption of existing memories is generally relatively high when the memories perform functions. Therefore, how to reduce the dynamic power consumption of the memories becomes an urgent technical problem to be resolved.

SUMMARY

The present disclosure relates to the field of semiconductor technologies, and in particular, to a clock signal generation circuit and method, and a memory.

The present disclosure provides a clock signal generation circuit and method, and a memory, to resolve, to some extent, at least a problem that dynamic power consumption of a memory is relatively high in a related technology.

Other features and advantages of the present disclosure become clear based on the following detailed descriptions, or are partially learned by the practice of the present disclosure.

According to an aspect of the present disclosure, a clock signal generation circuit is provided, including:

- a command predecoding circuit, configured to decode partial command bits in a command, to obtain a predecoded command signal;
- a command decoding circuit, configured to decode the command, to obtain an internal command signal;
- a counter circuit, configured to count a clock cycle based on an initial clock signal, to generate a first counting signal and a second counting signal; and
- a clock signal interception circuit, connected to the command predecoding circuit, the command decoding circuit, and the counter circuit, and configured to intercept the initial clock signal based on the predecoded command signal, the internal command signal, the first counting signal, and the second counting signal, to obtain a target clock signal.

According to another aspect of the present disclosure, a memory is provided, including the foregoing clock signal generation circuit.

According to still another aspect of the present disclosure, a clock signal generation method is provided, including the steps as follows:

A command decoding circuit decodes an input command, to obtain an internal command signal.

A counter circuit counts a clock cycle based on an initial clock signal, to generate a counting signal.

A clock signal interception circuit intercepts the initial clock signal based on the internal command signal and the counting signal, to obtain a target clock signal.

According to still another aspect of the present disclosure, a clock signal generation method is provided, including the steps as follows:

Partial command bits in a command are decoded, to obtain a predecoded command signal.

A clock cycle is counted based on an initial clock signal, to generate a first counting signal.

The initial clock signal is intercepted based on the predecoded command signal and the first counting signal, to obtain a first intercepted clock signal.

The command is decoded, to obtain an internal command signal.

The clock cycle is counted based on the initial clock signal, to generate a second counting signal.

The first intercepted clock signal is intercepted based on the internal command signal and the second counting signal, to obtain a target clock signal.

According to the clock signal generation circuit and method, and the memory that are provided in the embodiments of the present disclosure, after the predecoding command is obtained by decoding partial command bits in the command based on the command predecoding circuit, the internal command signal is obtained through decoding based on the command decoding circuit, and the first counting signal and the second counting signal are generated by counting the clock cycle for the initial clock signal by the counter circuit, because the predecoded command signal and the internal command signal are related to the command, and because the first counting signal and the second counting signal are obtained by performing counting for the initial clock signal, a part of the initial clock signal may be intercepted based on the predecoded command signal, the internal command signal, a counting result of the first counting signal, and a counting result of the second counting signal, to obtain the target clock signal matching the command. A target clock signal of each command can match an operation time of each command. Compared with a technical solution in which the same clock signal is employed for each command, in the embodiments of the present disclosure, a dynamic loss of the memory caused by continuous flipping of a clock of an unnecessary cycle generated due to mismatching between the clock cycle and the command during operation of the command is avoided, thereby reducing the dynamic loss of the memory.

It should be understood that the foregoing general descriptions and the following detailed descriptions are merely examples and explanations, and are not intended to limit the present disclosure.

BRIEF DESCRIPTION OF DRAWINGS

The accompanying drawings herein, which are incorporated in and constitute a part of this specification, illustrate embodiments conforming to the present disclosure, and are employed together with this specification to explain the principles of the present disclosure. Clearly, the accompanying drawings in the following descriptions show merely some embodiments of the present disclosure, and a person of ordinary skill in the art may still derive other drawings from these accompanying drawings without creative efforts.

DETAILED DESCRIPTION

Figure 1:
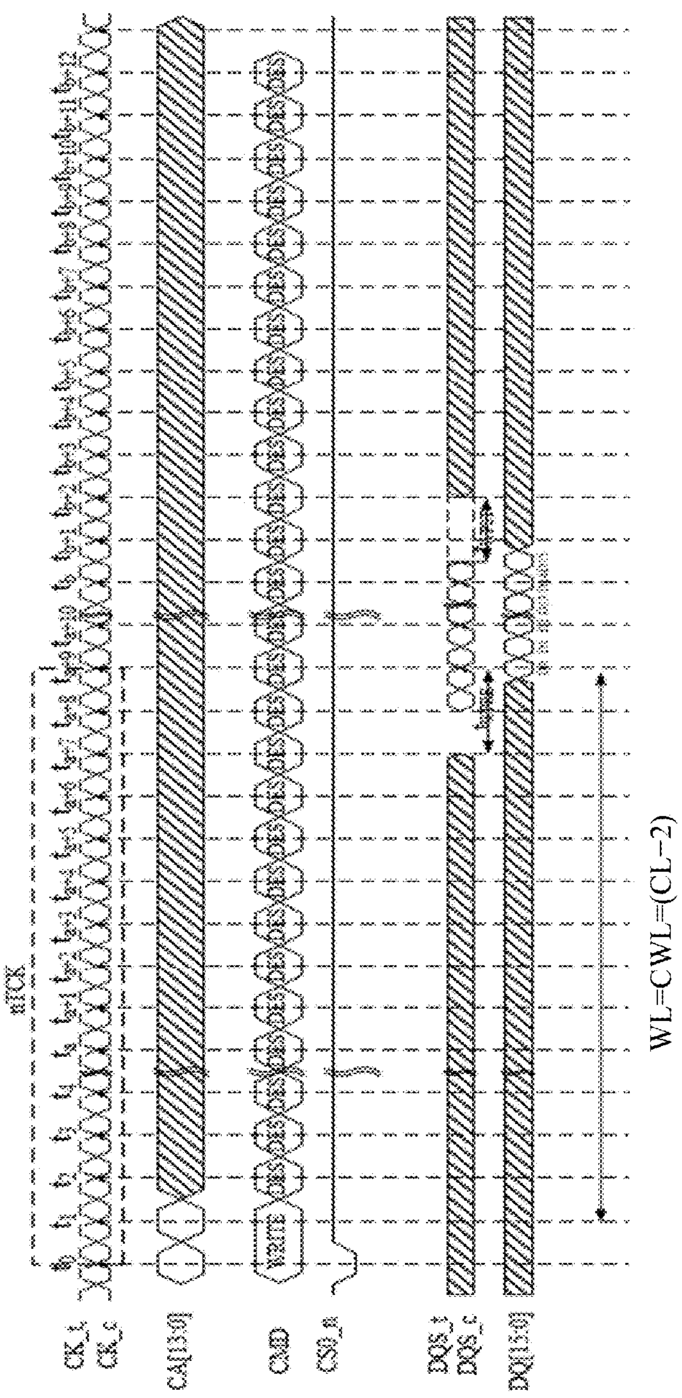
FIG. 1 is a schematic diagram of example command timing according to an embodiment of the present disclosure.

Now, example implementations are more comprehensively described with reference to the accompanying drawings. However, the example implementations can be implemented in multiple forms and should not be construed as being limited to the examples described herein. Instead, these implementations are provided to make the present disclosure more comprehensive and complete, and convey the concept of the example implementations comprehensively to a person skilled in the art. The described features, structures, or characteristics may be properly combined in one or more implementations.

In addition, the accompanying drawings are merely schematic illustrations of the present disclosure, and are not necessarily drawn to scale. The same reference numerals in the figures represent the same or similar parts, and therefore, repeated descriptions thereof are omitted. Some block diagrams shown in the accompanying drawings are functional entities and may not necessarily correspond to physically or logically independent entities. These functional entities may be implemented in a form of software, or these functional entities are implemented in one or more hardware modules or integrated circuits, or these functional entities are implemented in different networks and/or processor apparatuses and/or microcontroller apparatuses.

It should be understood that steps recorded in the method implementations of the present disclosure may be performed in different sequences, and/or performed in parallel. In addition, the method implementations may include additional steps and/or skip performing shown steps. The scope of the present disclosure is not limited in this respect.

It should be noted that the concepts such as “first” and “second” mentioned in the present disclosure are merely employed to distinguish between different apparatuses, modules, or units, and are not intended to limit a sequence or an interdependence of functions performed by these apparatuses, modules, or units.

It should be noted that the modifications “one” and “multiple” mentioned in the present disclosure are examples and constitute no limitation, and a person skilled in the art should understand that, unless otherwise explicitly specified in the context, the modifications “one” and “multiple” should be understood as “one or more”. In addition, unless otherwise explicitly specified and defined, the terms “connected” and “connection” should be understood in a broad sense, for example, may be a fixed connection, or may be a detachable connection, or may be an integral connection, or may be a direct connection, or may be an indirect connection through an intermediate medium. A person of ordinary skill in the art may understand specific meanings of the foregoing terms in this application based on a specific situation.

Before the technical solutions provided in the embodiments of the present disclosure start to be described, the technical terms involved in the embodiments of the present disclosure are first described.

(1) Column address write latency (CWL): After completely sending a write command, a storage controller may send written data only after awaiting the CWL.

(2) Write recovery time (tWR) is a latency after the data is completely written and before a precharge command. The tWR is employed to describe a quantity of clock cycles that need to be awaited before a valid write operation and precharging are completed in one activated memory array (bank). The necessary clock cycles are employed to ensure that data in a write buffer can be written into a memory cell before precharging occurs.

(3) Unit clock cycle (Clock Time, tCK): The tCK may serve as a basic unit of a memory clock.

(4) Command/Address (CA) bus: The command/address bus is configured to transmit an address signal and a command signal between a chip and an external device.

After the foregoing technical terms are described, the following describes the technical solutions provided in the embodiments of the present disclosure.

As described in the background, how to reduce dynamic power consumption of a memory becomes an urgent technical problem to be resolved.

The inventor finds, through a research, that in a command transmission scenario of a memory such as a DRAM, after the memory receives a command (CMD), an operation corresponding to the command usually needs to be completed with a clock signal after the command is decoded. For example, FIG. 1 is a schematic diagram of example command timing according to an embodiment of the present disclosure. After a clock signal CK_t/CK_c shown in FIG. 1 is received by a receiver, the clock signal CK_t/CK_c may be frequency-divided into odd and even clocks PCLK_E/O, and PCLK_E/O serves as a clock signal, to complete an operation corresponding to each command in a clock cycle corresponding to the odd and even clocks PCLK_E/O.

However, the inventor finds, through a further research, that different commands require different operation times. For example, when a burst length (BL) requires 16 tCK, the CWL is equal to 64 tCK, and the tWR is equal to 96 tCK, a generation time required by a write with auto precharge (WRA) command is CWL+BL/2+tWR. That is, 168 (that is, 64+16/2+96) tCK are required. BL is short for burst length. For another example, a clock cycle required by a write (WR) command may be CWL+BL/2. That is, 72 (that is, 64+16/2) tCK are required. It should be noted that, when the CWL, the BL, and the tWR are specified as other cycle lengths, a clock cycle required by each command may be another value. This is not specifically limited.

Figure 2:
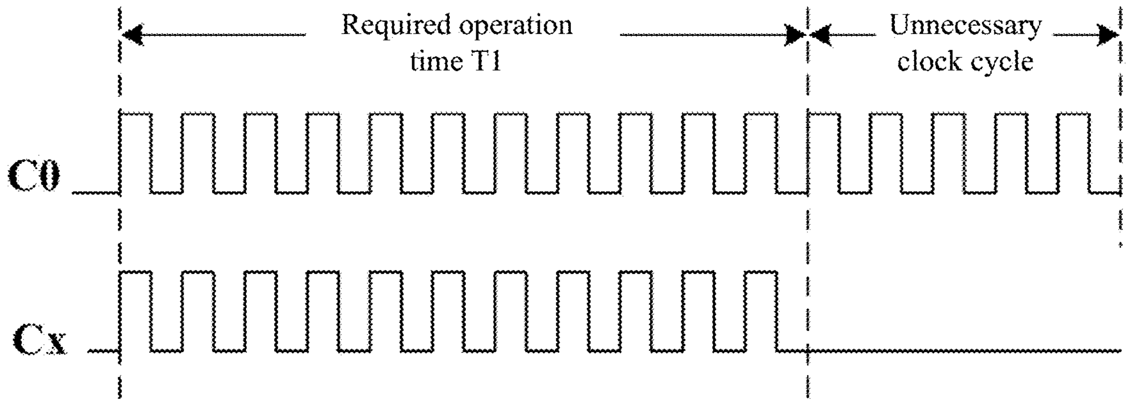
FIG. 2 is a schematic diagram of example timing of a clock signal according to an embodiment of the present disclosure.

Correspondingly, FIG. 2 is a schematic diagram of example timing of a clock signal according to an embodiment of the present disclosure. As shown in FIG. 2, a cycle of a clock signal C0 is a unit clock cycle. If an operation time required by a command is T1, a unit clock cycle corresponding to the required operation time T1 is a unit clock cycle required for operating the command, and a unit clock cycle other than the unit clock cycle required for operating the command is an unnecessary clock cycle.

If a related operation of a decoded command is performed based on the clock signal C0, the clock signal continuously flips in the unnecessary clock cycle. Consequently, a dynamic loss of a memory is caused, and power is consumed.

Based on this, embodiments of the present disclosure provide a clock signal generation circuit and method, and a memory, which may be applied to the field of semiconductor technologies, in particular, the clock signal generation field. In the embodiments of the present disclosure, a target clock signal of each command can match an operation time required by each command. For example, a cycle quantity of unit clock cycles included in a target clock signal Cx shown in FIG. 2 is equal to a quantity of clock cycles required by the command. Compared with a technical solution in which the same clock signal is employed for each command, in the embodiments of the present disclosure, a dynamic loss of the memory caused by continuous flipping of a clock of an unnecessary cycle generated due to mismatching between the clock cycle and the command during operation of the command is avoided, thereby reducing the dynamic loss of the memory. Optionally, to further reduce the dynamic loss of the memory, as shown in FIG. 2, the target clock signal Cx may be in a low level state in a time period corresponding to the clock of the unnecessary cycle.

The following describes the technical solutions provided in the embodiments of the present disclosure.

Before the technical solutions provided in the embodiments of the present disclosure start to be described, a storage system involved in the embodiments of the present disclosure is first described.

Figure 3:
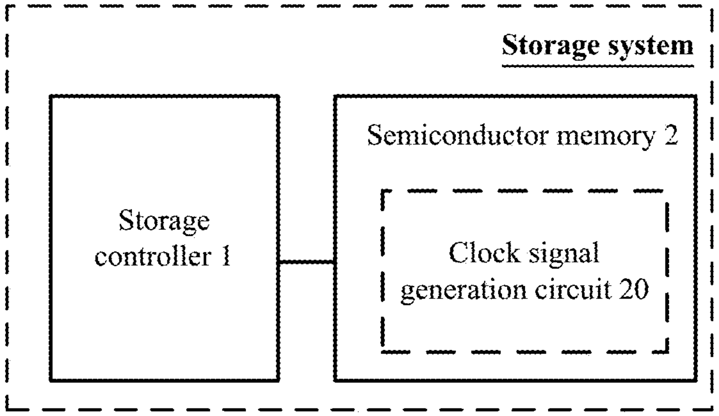
FIG. 3 is a system architectural diagram of a storage system according to an embodiment of the present disclosure.

FIG. 3 is a system architectural diagram of a storage system according to an embodiment of the present disclosure. As shown in FIG. 3, the storage system may include a storage controller 1 and a semiconductor memory 2.

The storage controller 1 may deliver a command to the semiconductor memory 2, so that the semiconductor memory 2 performs various functions. For example, each command may be transmitted between the storage controller 1 and the semiconductor memory 2 through a command/address (CA) bus.

In this embodiment of the present disclosure, the storage controller 1 may be a host device, for example, may be a system on a chip (SOC). It should be noted that the host device may alternatively be another host device such as a central processing unit (CPU). This is not specifically limited.

The semiconductor memory 2 may include a clock signal generation circuit 20. The clock signal generation circuit 20 may generate a target clock signal matching the command, to perform a related operation of the command based on the target clock signal after the command is decoded.

In this embodiment of the present disclosure, the semiconductor memory 2 may be a dynamic random access memory (DRAM), a static random access memory (SRAM), or a flash memory. For example, the semiconductor memory may be a double data rate synchronous dynamic random access memory (DDR SDRAM) or a low power double data rate synchronous dynamic random access memory (LPDDR SDRAM). For example, the semiconductor memory may be DDR3, DDR4, DDR5, DDR6, LPDDR4, LPDDR5, or LPDDR6. However, a form of the semiconductor memory is not limited in the present disclosure.

After the storage system provided in this embodiment of the present disclosure is preliminarily described, the following describes the command involved in this embodiment of the present disclosure.

The command may be a command for controlling the semiconductor memory 2 to perform various functions. In this embodiment of the present disclosure, the command may be a command for which a clock signal needs to be generated. For example, Table 1 is a true value table of the command. “H” indicates a high level, and “L” indicates a low level.

TABLE 1

| | | | | | | | |
|---|---|---|---|---|---|---|---|
| Write pattern command | WRP | L | H | L | L | H | L |
| | | H | V | C3 | C4 | C5 | C6 |
| Write pattern with auto precharge command | WRPA | L | H | L | L | H | L |
| | | H | V | C3 | C4 | C5 | C6 |
| Mode register write command | MRW | L | H | L | H | L | L |
| | | H | OP0 | OP1 | OP2 | OP3 | OP4 |
| Mode register read command | MRR | L | H | L | H | L | H |
| | | H | L | L | V | V | V |
| Write command | WR | L | H | L | H | H | L |
| | | H | V | C3 | C4 | C5 | C6 |
| Write with auto precharge command | WRA | L | H | L | H | H | L |
| | | H | V | C3 | C4 | C5 | C6 |
| Read command | RD | L | H | L | H | H | H |
| | | H | C2 | C3 | C4 | C5 | C6 |
| Read with auto precharge command | RDA | L | H | L | H | H | H |
| | | H | C2 | C3 | C4 | C5 | C6 |

It may be learned from Table 1 that, for the write pattern (WRP) command and the write pattern with auto precharge (WRPA) command, command bits CA0 to CA4 are “HLLHL”.

In addition, for each of the mode register write (MRW) command, the mode register read (MRR) command, the write (WR) command, the write with auto precharge (WRA) command, the read (RD) command, and the read with auto precharge (RDA) command, command bits CA0 to CA2 are "HLH".

After the command is preliminarily described, the following describes the example implementations in detail with reference to the accompanying drawings and embodiments.

Figure 4:
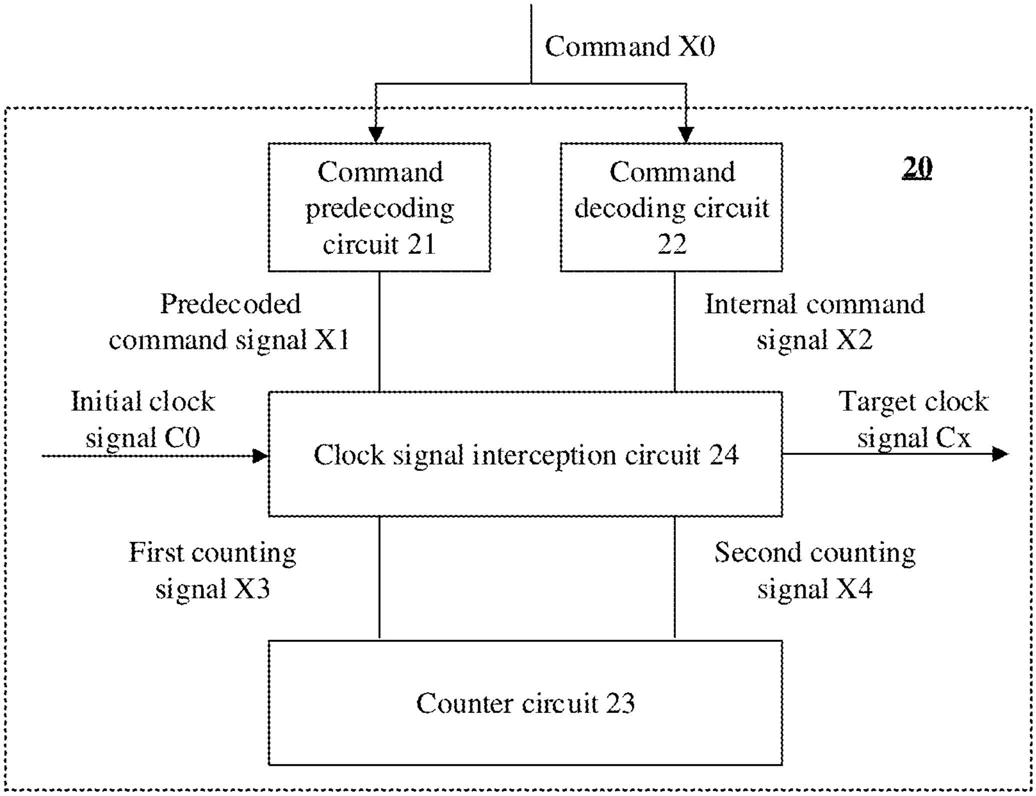
FIG. 4 is a schematic circuit diagram of a clock signal generation circuit according to an embodiment of the present disclosure.

FIG. 4 is a schematic circuit diagram of a clock signal generation circuit according to an embodiment of the present disclosure. As shown in FIG. 4, a clock signal generation circuit 20 provided in this embodiment of the present disclosure may include a command predecoding circuit 21, a command decoding circuit 22, a counter circuit 23, and a clock signal interception circuit 24. Next, each component circuit of the clock signal generation circuit 20 is described.

The command predecoding circuit 21 is configured to decode partial command bits in a command X0, to obtain a predecoded command signal X1.

The command X0 may be a to-be-processed command sent by a storage controller 1 to a semiconductor memory 2. For example, the command X0 may include but is not limited to one or more of an MRW command, an MRR command, a WR command, a WRA command, an RD command, or an RDA command. This is not specifically limited.

In some embodiments, the command X0 may be divided into multiple types of commands with different command features. All the types of commands have some same command bits. For different types of commands, the same command bit has different locations, or there are different quantities of same command bits, for example, a first-type command whose command bits CA0 to CA4 are "HLLHL", and for another example, a second-type command whose command bits CA0 to CA2 are "HLH". For specific content of the first-type command and the second-type command, refer to related descriptions of the foregoing part of the embodiments of the present disclosure with reference to Table 1. Details are not described again.

Figure 5:
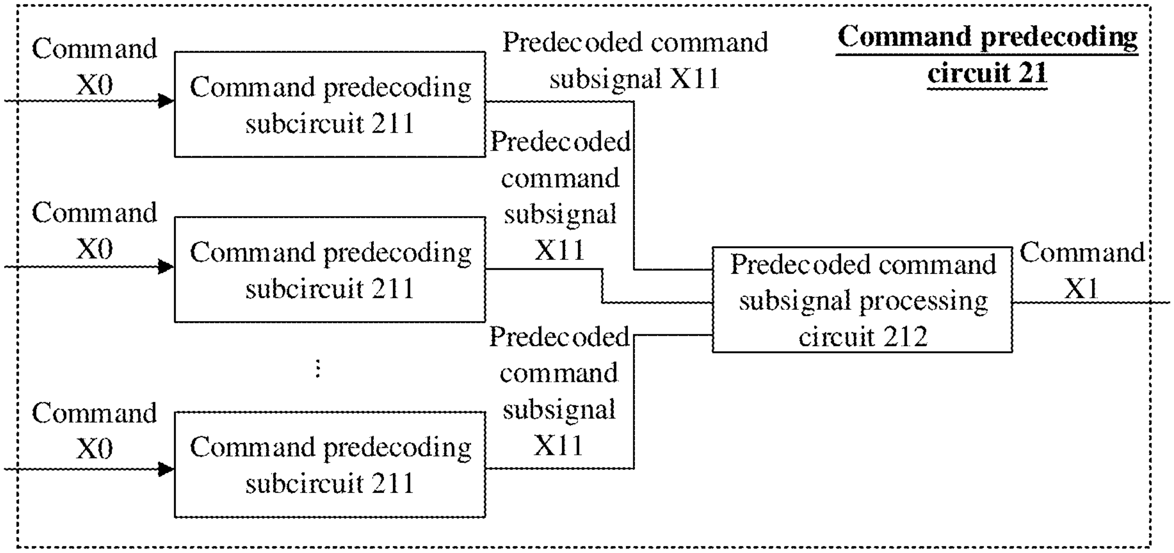
FIG. 5 is a schematic circuit diagram of a command predecoding circuit according to an embodiment of the present disclosure.

In some embodiments, FIG. 5 is a schematic circuit diagram of a command predecoding circuit according to an embodiment of the present disclosure. As shown in FIG. 5, the command predecoding circuit 21 may include multiple command predecoding subcircuits 211 and a predecoded command subsignal processing circuit 212.

For the multiple command predecoding subcircuits 211, different command predecoding subcircuits 211 decode different quantities of command bits/command bits at different locations, and each command predecoding subcircuit is configured to predecode the command, to obtain a predecoded command subsignal. For example, one command predecoding subcircuit 211 may decode the command bits CA0 to CA2, and another command predecoding subcircuit 211 may decode the command bits CA0 to CA4. The two command predecoding subcircuits decode different quantities of command bits. For another example, one command predecoding subcircuit 211 may decode the command bits CA0 to CA2, and another command predecoding subcircuit 211 may decode command bits CA0, CA1, and CA4. The two command predecoding subcircuits decode different quantities of command bits.

For example, each command predecoding subcircuit is configured to: when a decoded command bit is at a preset level corresponding to each command bit, adjust an output predecoded command subsignal to be at a third level; and when one or more decoded command bits are not at a preset level corresponding to each command bit, adjust the output predecoded command subsignal to be at a fourth level. One of the third level and the fourth level is a high level signal, and the other thereof is a low level signal. In an embodiment, the command predecoding circuit 21 may include a first command predecoding circuit 211_1 and a second command predecoding circuit 211_2.

The first command predecoding circuit 211_1 may decode the command bits CA0 to CA4, and when the command bits CA0 to CA4 are "HLLHL", pull up an output predecoded command subsignal PRE_CMD1 to be at a high level.

Figure 6:
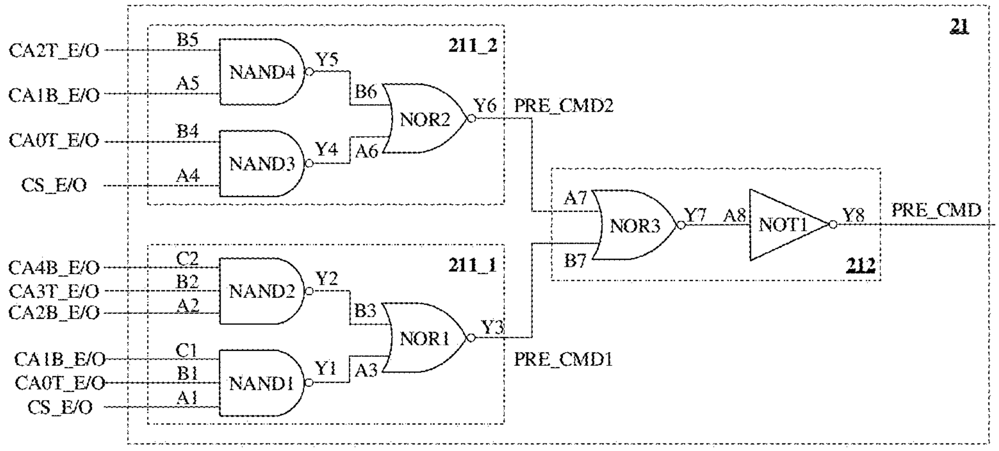
FIG. 6 is a schematic circuit diagram of an example command predecoding circuit according to an embodiment of the present disclosure.

In an example, FIG. 6 is a schematic circuit diagram of an example command predecoding circuit according to an embodiment of the present disclosure. As shown in FIG. 6, the first command predecoding circuit 211_1 may include a first NAND gate NAND1, a second NAND gate NAND2, and a first NOR gate NOR1.

The first NAND gate NAND1 includes a first input terminal A1, a second input terminal B1, a third input terminal C1, and an output terminal Y1. The first input terminal A1 of the first NAND gate NAND1 is configured to receive a chip selection signal CS_E/O, the second input terminal B1 is configured to receive an original value signal CA0T_E/O of a command bit CA0, and the third input terminal C1 is configured to receive an inverted signal CA1B_E/O of a command bit CA1. When the chip selection signal CS_E/O is H (the high level, which corresponds to a logical value 1), the command bit C0 is H, and the command bit C1 is L (a low level, which corresponds to a logical value 0), the first input terminal A1, the second input terminal B1, and the third input terminal C1 each receive a high level signal. In this case, the output terminal Y1 outputs a low level signal.

The second NAND gate NAND2 includes a first input terminal A2, a second input terminal B2, a third input terminal C2, and an output terminal Y2. The first input terminal A2 is configured to receive an inverted signal CA2B_E/O of a command bit CA2, the second input terminal B2 is configured to receive an original value signal CA3T_E/O of a command bit CA3, and the third input terminal C2 is configured to receive an inverted signal CA4B_E/O of a command bit CA4. When the command bit C2 is L, the command bit C3 is H, and the command bit C4 is L, the first input terminal A2, the second input terminal B2, and the third input terminal C2 each receive a high level. In this case, the output terminal Y2 outputs a low level. That is, when the command bits C2 to C4 are LHL, the output terminal Y2 outputs the low level.

The first NOR gate NOR1 includes a first input terminal A3, a second input terminal B3, and an output terminal Y3. The first input terminal A3 is connected to the output terminal Y1, the second input terminal B3 is connected to the output terminal Y2, and when the output terminal Y1 and the output terminal Y2 each output a low level, the output terminal Y3 outputs a high level.

That is, for the first command predecoding circuit 211_1 shown in FIG. 6, when the command bit CS is H and the command bits C0 to C4 are HLLHL, the first command predecoding circuit 211_1 outputs a high level predecoded command subsignal PRE_CMD1.

The second command predecoding circuit 211_2 may decode the command bits CA0 to CA2, and when the command bits CA0 to CA2 are "HLH", pull up an output predecoded command subsignal PRE_CMD2 to be at the high level.

In an example, still as shown in FIG. 6, the second command predecoding circuit 211_2 includes a third NAND gate NAND3, a fourth NAND gate NAND4, and a second NOR gate NOR2.

The third NAND gate NAND3 includes a first input terminal A4, a second input terminal B4, and an output terminal Y4. The first input terminal A4 is configured to receive a chip selection signal CS_E/O, and the second input terminal B4 is configured to receive an original value signal CA0T_E/O of the command bit CA0. When the chip selection signal CS_E/O is H and the command bit C0 is H, the first input terminal A4 and the second input terminal B4 each receive a high level signal. In this case, the output terminal Y4 outputs a low level signal.

The fourth NAND gate NAND4 includes a first input terminal A5, a second input terminal B5, and an output terminal Y5. The first input terminal A5 is configured to receive an inverted signal CA1B_E/O of the command bit CA1, and the second input terminal B5 is configured to receive an original value signal CA2T_E/O of the command bit CA2. When the command bit C1 is L and the command bit C2 is H, the first input terminal A5 and the second input terminal B5 each receive a high level. In this case, the output terminal Y5 outputs a low level.

The second NOR gate NOR2 includes a first input terminal A6, a second input terminal B6 and an output terminal Y6. The first input terminal A6 is connected to the output terminal Y4, the second input terminal B6 is connected to the output terminal Y5, and when the output terminal Y4 and the output terminal Y5 each output a low level, the output terminal Y6 outputs a high level.

That is, for the second command predecoding circuit 211_2 shown in FIG. 6, when the command bit CS is H and the command bits C0 to C2 are HLH, the second command predecoding circuit 211_2 outputs the high level predecoded command subsignal PRE_CMD2.

It should be noted that the command predecoding subcircuit 211 may further implement, based on a decoding requirement, another circuit, device, or functional module that can adjust the predecoded command subsignal to be at the third level when a preset level corresponding to each command bit is received at the decoded command bit. This is not specifically limited.

The predecoded command subsignal processing circuit 212 is connected to the multiple command predecoding subcircuits 211, and is configured to combine multiple predecoded command subsignals, to generate the predecoded command signal. For example, the predecoded command subsignal processing circuit 212 is configured to: output a predecoded command signal corresponding to a fifth level when one or more predecoded command subsignals are at the third level; and similarly, output a predecoded command signal corresponding to a sixth level when the multiple predecoded command subsignals each are at the fourth level. One of the fifth level and the sixth level is a high level, and the other thereof is a low level.

In an example, still as shown in FIG. 6, the predecoded command subsignal processing circuit 212 may include a third NOR gate NOR3 and a first NOT gate NOT1.

The third NOR gate NOR3 includes a first input terminal A7, a second input terminal B7, and an output terminal Y7. The first NOT gate NOT1 includes an input terminal A8 and an output terminal Y8. When the first input terminal A7 and/or the second input terminal B8 receive/receives a high level, the output terminal Y8 outputs a high level.

It should be noted that the command predecoding circuit 21 may alternatively be implemented as another circuit that can combine the multiple predecoded command subsignals, e.g., an AND gate. This is not specifically limited.

In an embodiment, the predecoded command subsignal processing circuit 212 may further receive a predecoding control signal. The predecoding control signal is configured to indicate to enable or disable predecoding. In addition, when the predecoding control signal indicates to enable predecoding, the multiple predecoded command subsignals are combined, to generate the predecoded command signal.

Figure 7:
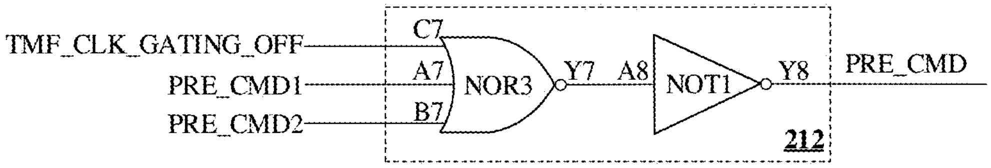
FIG. 7 is a schematic circuit diagram of an example predecoded command subsignal processing circuit according to an embodiment of the present disclosure.

In an example, FIG. 7 is a schematic circuit diagram of an example predecoded command subsignal processing circuit according to an embodiment of the present disclosure. As shown in FIG. 7, a difference between a predecoded command subsignal processing circuit shown in FIG. 7 and the predecoded command subsignal processing circuit 212 shown in FIG. 6 lies in that the third NOR gate NOR3 may further include a third input terminal C7. The third input terminal C7 is configured receive a predecoding control signal TMF_CLK_GATING_OFF. A high level of the predecoding control signal TMF_CLK_GATING_OFF indicates to enable predecoding, and a low level indicates to disable predecoding. Because the predecoding control signal TMF_CLK_GATING_OFF may indicate to enable/disable predecoding, correspondingly, in this example, predecoding may be flexibly controlled, to improve flexible control of a clock signal generation process.

In the command predecoding circuit 21 provided in this embodiment of the present disclosure, the multiple types of commands with different command features may be accurately predecoded in advance by the multiple command predecoding subcircuits 211, so that when any one of the multiple types of commands is received, a counter can be triggered accurately and quickly to generate a target clock signal corresponding to the command, to improve a generation rate and accuracy of the target clock signal.

In addition, because multiple commands usually have the same command bit, in the command predecoding circuit, the multiple types of commands may be effectively predecoded by a small quantity of command predecoding subcircuits 211, to reduce circuit costs while predecoding precision is ensured.

In addition, it should be further noted that the command predecoding circuit 21 may alternatively be implemented as another circuit, device, or functional module that can have a command decoding function. This is not specifically limited.

After the command predecoding circuit 21 is described, the command decoding circuit 22 continues to be described below.

Figure 8:
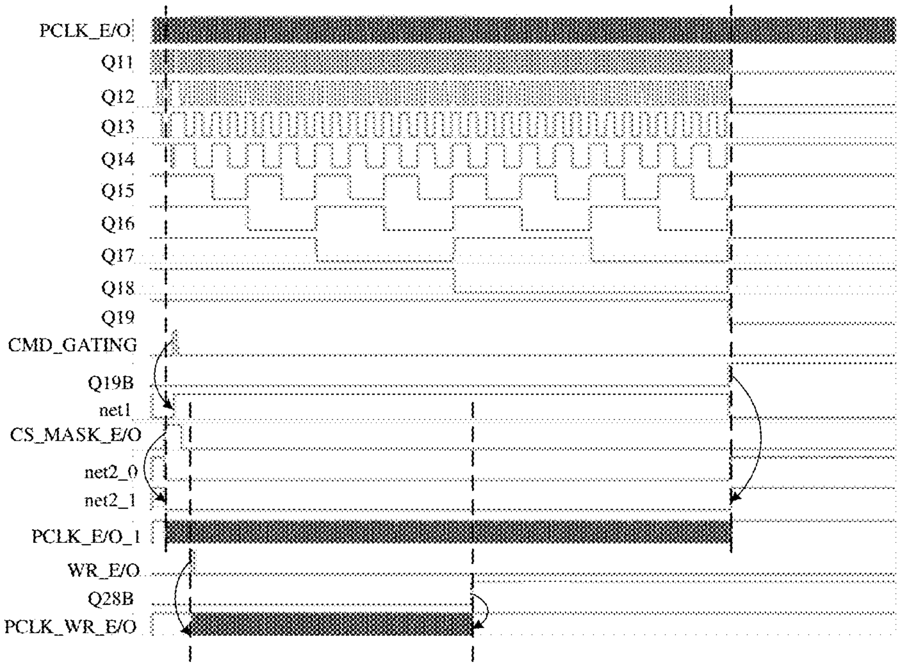
FIG. 8 is a schematic diagram of example signal timing according to an embodiment of the present disclosure.

The command decoding circuit 22 is configured to decode the command X0, to obtain an internal command signal X2. For example, the internal command signal X2 may be an internal command signal X2 that is obtained by decoding the command X0 and that can be processed by the semiconductor memory 2. For example, the internal command signal X2 may be an active pulse signal of the command X0. For example, FIG. 8 is a schematic diagram of example signal timing according to an embodiment of the present disclosure. A write command is taken as an example. An internal command signal X2 of the write command may be WR_E/O shown in FIG. 8.

The command decoding circuit 22 may be implemented as a circuit, a functional module, or an apparatus that has the command decoding function. This is not specifically limited.

After the command decoding circuit 22 is described, the counter circuit 23 continues to be described below.

The counter circuit 23 is configured to count a clock cycle based on an initial clock signal C0, to generate a first counting signal X3 and a second counting signal X4.

To facilitate understanding of the counter circuit 23, before a specific circuit of the counter circuit 23 is described, technical terms related to the counter circuit 23 are first described below.

The initial clock signal C0 may be a cyclic clock signal whose cycle is a unit clock cycle tCK. For example, the initial clock signal C0 may be an output initial clock signal PCLK_E/O in FIG. 8.

For the first counting signal X3, duration of an active level of the first counting signal X3 may be $2^{M-1}$ unit clock cycles tCK, to intercept a clock signal with $2^{M-1}$ unit clock cycles at the active level. The active level is a level employed to intercept a clock signal, for example, may be a high level or a low level. This is not specifically limited. In an embodiment, the first counting signal X3 may flip once on the $(p\times 2^{M-1}+1)$th triggering edge of the initial clock signal. Herein, P is a positive integer. For example, M=9 is taken as an example. The first counting signal X3 flips once on the 1st triggering edge, the 257th triggering edge, the 513rd triggering edge, . . . of the initial clock signal. Correspondingly, a clock signal with 256 unit clock cycles may be intercepted based on the first counting signal X3. M is an integer greater than or equal to 1, and $2^{M-1}$ is greater than or equal to a quantity of clock cycles required by the command.

For the second counting signal X4, duration of an active level may be $2^{N-1}$ unit clock cycles tCK, to intercept a clock signal with $2^{N-1}$ unit clock cycles based on the active level. The active level is a level employed to intercept a clock signal, for example, may be a high level or a low level. This is not specifically limited. In an embodiment, the first counting signal X3 may flip once on the $(p\times 2^{N-1}+1)$th triggering edge of the initial clock signal. Herein, P is a positive integer. For example, N=8 is taken as an example. The first counting signal X3 flips once on the 1st triggering edge, the 129th triggering edge, the 257th triggering edge, the 385th triggering edge, . . . of the initial clock signal. Correspondingly, a clock signal with 128 unit clock cycles may be intercepted based on the second counting signal X4. N is an integer greater than or equal to 1, N is less than or equal to M, and $2^{N-1}$ is greater than or equal to a quantity of clock cycles required by the command.

After the technical terms related to the counter circuit 23 are described, a specific circuit of the counter circuit 23 continues to be described below.

In some embodiments, the first counting signal X3 and the second counting signal X4 may be generated by the same counter circuit. For example, the first counting signal X3 and the second counting signal X4 may be obtained by an asynchronous counter formed by cascading multiple stages of DFFs.

Correspondingly, the counter circuit 23 may include a first counter circuit configured to generate the first counting signal X3 and the second counting signal X4.

Figure 9:
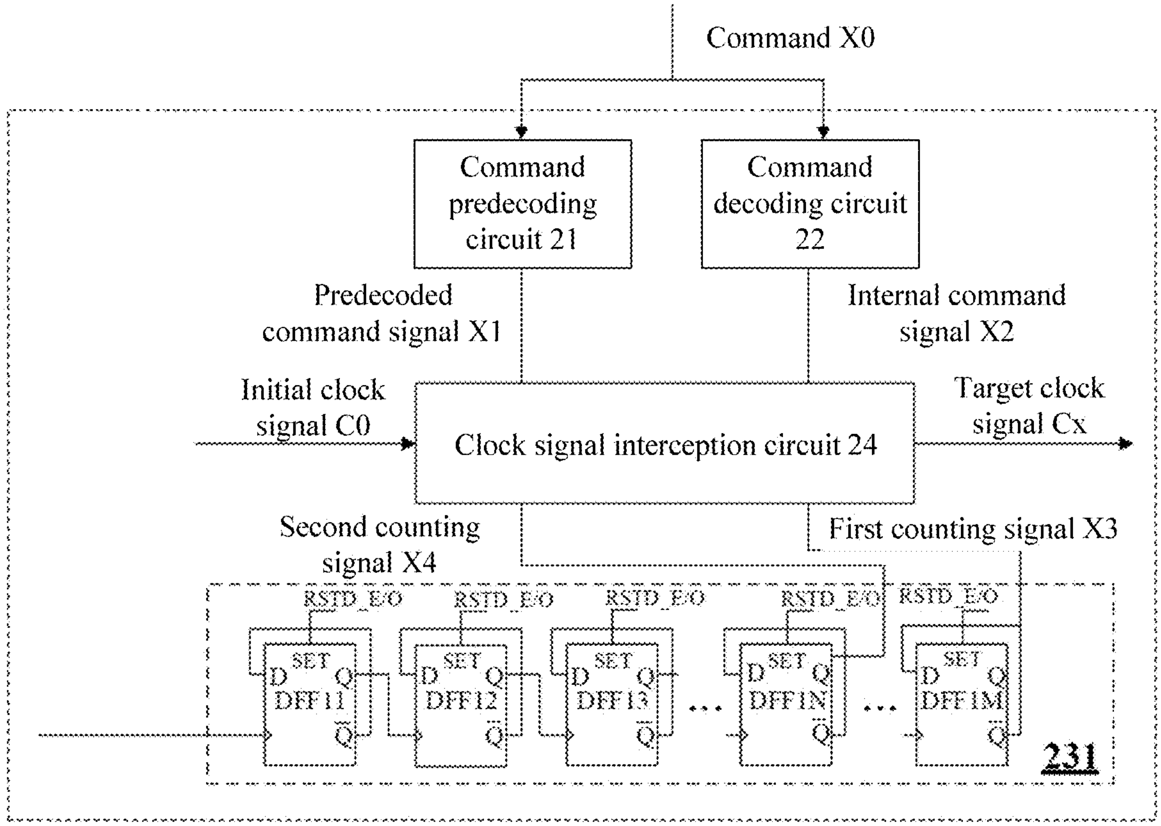
FIG. 9 is a schematic diagram of a counter circuit according to an embodiment of the present disclosure.

In an example, FIG. 9 is a schematic diagram of a counter circuit according to an embodiment of the present disclosure. As shown in FIG. 9, a first counter circuit 231 may include M stages of first flip-flops DFF11 to DFF1M. An output signal of the ith stage of first flip-flop flips once on the $(p\times 2^{N-1}+1)$th triggering edge of the initial clock signal. Herein, i is any positive integer less than or equal to M. An output signal of the Mth stage of first flip-flop is the first counting signal X3, an output signal of the Nth stage of first flip-flop is the second counting signal, and M and N are integers greater than or equal to 1. For example, the output signal of the Mth stage of first flip-flop may be an output signal of a non-inverting output terminal Q of the Mth stage of first flip-flop DFF1M or an output signal of an inverting output terminal Q. For example, the output signal may be the output signal of the inverting output terminal. For example, a triggering edge of the initial clock signal may be a rising edge or a falling edge. This is not specifically limited.

In an example, for any two adjacent stages of first flip-flops, a non-inverting output terminal Q of the former stage of flip-flop is connected to a clock input terminal of the latter stage of flip-flop. An inverting output terminal Q of each stage of flip-flop is connected to an input terminal D of the stage of flip-flop. A clock input terminal of a 1st stage of flip-flop receives the initial clock signal, an inverting output terminal Q of the Nth stage of flip-flop outputs the second counting signal X4, and an inverting output terminal Q of the Mth stage of flip-flop outputs the first counting signal X3.

In a specific example, still as shown in FIG. 8, an output signal of the 1st stage of first flip-flop DFF11 to an output signal of a non-inverting output terminal of the 9th stage of first flip-flop DFF19 are respectively Q11 to Q19. An inverting output signal output by an inverting output terminal of the 9th stage of first flip-flop DFF19 is Q19B.

Figure 10:
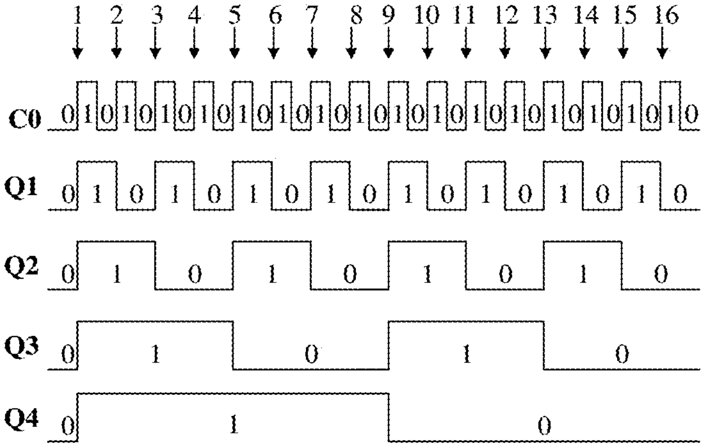
FIG. 10 is a schematic diagram of example timing of an output signal of each stage of first flip-flop.

Optionally, the latter stage of first flip-flop may perform signal flipping once on a triggering edge of an output signal of the former stage of first flip-flop. In a specific example, FIG. 10 is a schematic diagram of example timing of an output signal of each stage of first flip-flop. As shown in FIG. 10, an output signal Q1 of the 1st stage of first flip-flop may flip once on each triggering edge of the initial clock signal C0; an output signal Q2 of the 2nd stage of first flip-flop may flip once on each triggering edge of the output signal Q1; . . . .

In this embodiment of the present disclosure, the first counting signal X3 and the second counting signal X4 may be generated through different stages of first flip-flops of the first counter circuit 231, to improve a degree of integration of the counter circuit, optimize a circuit structure, and reduce circuit costs.

In an embodiment, the counter circuit 23 may further include a first counting control circuit 232 connected to the first counter circuit 231.

The first counting control circuit 232 is configured to receive the initial clock signal C0 and the output signal of the Mth stage of first flip-flop (the first counting signal X3 or an inverted signal of the first counting signal X3), and is configured to: when the output signal of the Mth stage of first flip-flop is at a first level, start the first counter circuit to perform counting based on the initial clock signal C0; and when the output signal of the Mth stage of first flip-flop is at a second level, control the first counter circuit to stop counting. One of the first level and the second level is a high level, and the other thereof is a low level. For example, the first level may be a high level, and the second level may be a low level.

Figure 11:
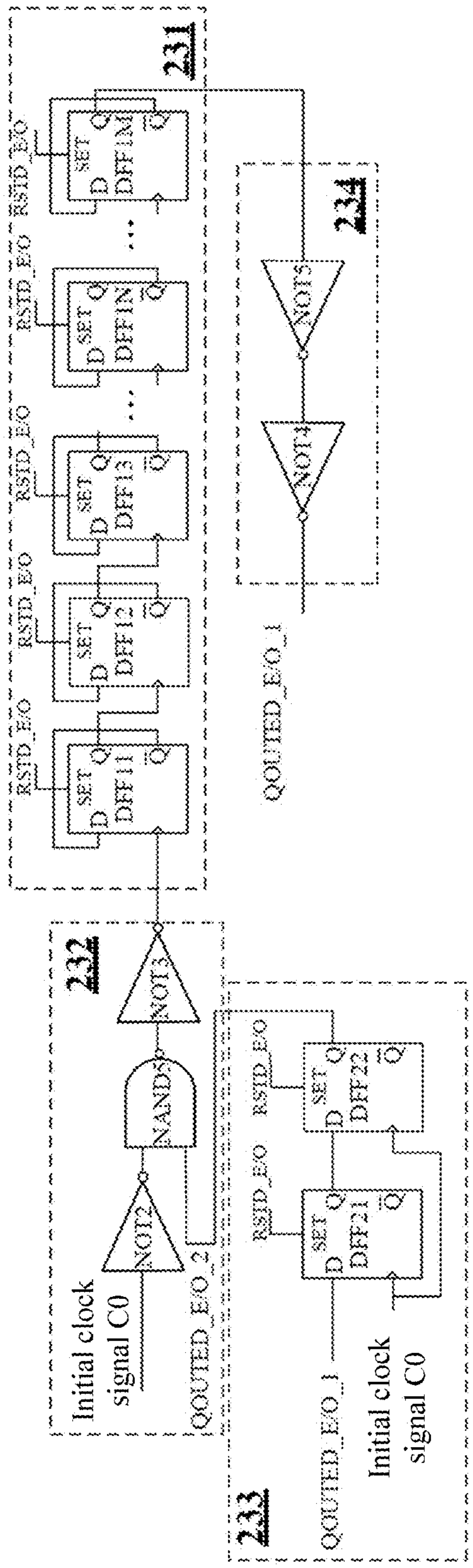
FIG. 11 is a schematic circuit diagram of a counter circuit.

In an example, FIG. 11 is a schematic circuit diagram of a counter circuit. As shown in FIG. 11, the first counting control circuit 232 may include a second NOT gate NOT2, a fifth NAND gate NAND5, and a third NOT gate NOT3.

The second NOT gate NOT2 is configured to invert the initial clock signal C0, to obtain an inverted signal of the initial clock signal C0. In addition, one terminal of the fifth NAND gate NAND5 receives the inverted signal of the initial clock signal C0, and the other terminal of the fifth NAND gate receives the output signal of the Mth stage of first flip-flop, and is configured to input the inverted signal of the initial clock signal C0 into a clock input terminal of the 1st stage of first flip-flop when the output signal of the Mth stage of first flip-flop is at a high level. For example, when counting is started at a low level and counting is ended at a high level, the first counting control circuit 232 may not include the third NOT gate NOT3.

It should be noted that the first counting control circuit 232 may alternatively be implemented as another circuit, apparatus, or functional module that can control, based on the output signal of the Mth stage of first flip-flop, the first counter circuit 231 to start or end counting. This is not specifically limited.

A counting process may be accurately controlled by the first counting control circuit 232 provided in this embodiment based on a level of the output signal of the Mth stage of first flip-flop. Based on the output signal of the Mth stage of first flip-flop, a counting function may be quickly disabled after a counting requirement is fulfilled, to improve counting efficiency, and reduce power consumption of a memory.

In an embodiment, the counter circuit may further include an output signal trimming circuit 233 and/or a signal driver circuit 234, to optimize signal quality of the output signal that is of the Mth stage of first flip-flop and that is received by the first counting control circuit 232.

The output signal trimming circuit 233 is configured to: trim an output signal QOUTED_E/O_1 of the Mth stage of first flip-flop based on the initial clock signal C0, so that a signal edge of an output signal QOUTED_E/O_2 that is of the Mth stage of first flip-flop and that is obtained through trimming is aligned with a signal edge of the initial clock signal C0, and provide the output signal QOUTED_E/O_2 that is of the Mth stage of first flip-flop and that is obtained through trimming to the first counting control circuit 232.

In an example, still as shown in FIG. 11, the output signal trimming circuit 233 may include multiple fourth flip-flops such as a fourth flip-flop DFF21 and a fourth flip-flop DFF22. A clock input terminal of each of the multiple fourth flip-flops is configured to receive the initial clock signal C0, a non-inverting output terminal of the former flip-flop in any two adjacent fourth flip-flops is connected to an input terminal of the latter flip-flop, an input terminal of the 1st fourth flip-flop is configured to receive the output signal QOUTED_E/O_1 of the Mth stage of first flip-flop, and a non-inverting output terminal of the last fourth flip-flop is configured to output the output signal QOUTED_E/O_2 that is of the Mth stage of first flip-flop and that is obtained through trimming.

The output signal QOUTED_E/O_2 in edge alignment with the initial clock signal C0 may be provided by the output signal trimming circuit 233 to the first counting control circuit 232, so that the first counting control circuit can provide the initial clock signal C0 with the complete cycle to the first counter circuit under control of the output signal QOUTED_E/O_2, to further improve counting precision.

It should be noted that the output signal trimming circuit 233 may alternatively be another circuit, apparatus, or functional module that performs edge alignment on two signals. This is not specifically limited.

The signal driver circuit 234 is configured to enhance a driving capability of the output signal QOUTED_E/O_1 of the Mth stage of first flip-flop. In an example, still as shown in FIG. 11, the signal driver circuit 234 may include a fourth NOT gate NOT4 and a fifth NOT gate NOT5.

It should be noted that the signal driver circuit 234 may alternatively be another circuit, apparatus, or functional module that can enhance a signal driving capability. This is not specifically limited.

In some other embodiments, the first counting signal X3 and the second counting signal X4 may be generated by different counter circuits. Correspondingly, the counter circuit 23 may include a second counter circuit 235 and a third counter circuit 236.

Figure 12:
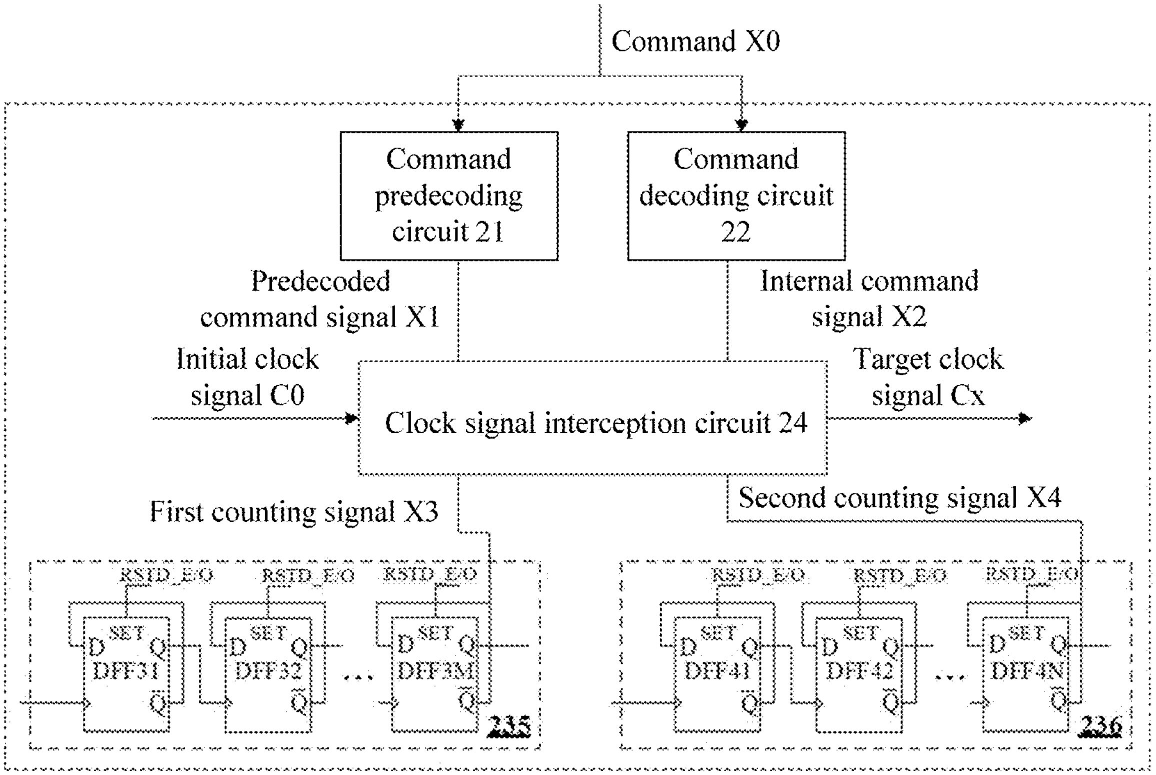
FIG. 12 is a schematic circuit diagram of another counter circuit according to an embodiment of the present disclosure.

In an example, FIG. 12 is a schematic circuit diagram of another counter circuit according to an embodiment of the present disclosure. As shown in FIG. 12, the second counter circuit 235 may include M stages of second flip-flops DFF31 to DFF3M. An output signal of the jth stage of second flip-flop flips once on the $(p\times2^{j-1}+1)$th triggering edge of the initial clock signal, an output signal of the Mth stage of second flip-flop (an inverting output signal or a non-inverting output signal of the Mth stage of second flip-flop) is the first counting signal X3, j is any positive integer less than or equal to M, and p is any positive integer. A connection manner of the M stages of second flip-flops DFF31 to DFF3M is similar to that of the M stages of first flip-flops DFF11 to DFF1M. Details are not described herein again.

Still as shown in FIG. 12, the third counter circuit 236 may include N stages of third flip-flops DFF41 to DFF4N. An output signal of the kth stage of third flip-flop flips once on the $(p\times2^{k-1}+1)$th triggering edge of the initial clock signal, an output signal of the Nth stage of third flip-flop (an inverting output signal or a non-inverting output signal of the Nth stage of third flip-flop) is a second counting signal, and k is any positive integer less than or equal to N. A connection manner of the N stages of third flip-flops DFF41 to DFF4N is similar to that of the M stages of first flip-flops DFF11 to DFF1M. Details are not described herein again.

The first counting signal X3 and the second counting signal X4 may be generated by the second counter circuit 235 and the third counter circuit 236 independently and accurately, to improve counting signal generation precision. Optionally, for different commands, the same second counter circuit 235 may be shared to generate the same first counting signal, to reduce circuit costs. Optionally, for different commands, respective third counter circuits 236 may be configured to generate respectively required second counting signals X4, to further reduce dynamic power consumption of a semiconductor and flexibility of generating the target counting signal.

Optionally, the counter circuit may further include a second counting control circuit connected to the second counter circuit 235 and/or a third counting control circuit connected to the third counter circuit 236.

The second counting control circuit may be configured to receive the initial clock signal and the output signal of the Mth stage of second flip-flop, and is configured to: when the output signal of the Mth stage of second flip-flop is at the first level, start the second counter circuit to perform counting based on the initial clock signal; and when the output signal of the Mth stage of second flip-flop is at the second level, control the second counter circuit to stop counting. The second counting control circuit is similar to the first counting control circuit. For details, refer to related descriptions of the first counting control circuit in the foregoing part of the embodiments of the present disclosure. Details are not described again.

The third counting control circuit is connected to the third counter circuit, is configured to receive a first intercepted clock signal and the output signal of the Nth stage of third flip-flop, and is configured to: when the output signal of the Nth stage of third flip-flop is at the first level, start the third counter circuit to perform counting based on the first intercepted clock signal; and when the output signal of the Nth stage of third flip-flop is at the second level, control the third counter circuit to stop counting. The third counting control circuit is similar to the first counting control circuit. For details, refer to related descriptions of the first counting control circuit in the foregoing part of the embodiments of the present disclosure. Details are not described again. Optionally, the third counting control circuit may further perform counting based on the initial clock signal C0. This is not specifically limited.

A counting process may be accurately controlled by the second counting control circuit provided in this embodiment based on a level of the output signal of the Mth stage of second flip-flop. Based on the output signal of the Mth stage of second flip-flop, a counting function may be quickly disabled after a counting requirement is fulfilled, to improve counting efficiency, and reduce power consumption of the memory. In addition, a counting process may be accurately controlled by the third counting control circuit provided in this embodiment based on a level of the output signal of the Nth stage of third flip-flop. Based on the output signal of the Nth stage of third flip-flop, a counting function may be quickly disabled after a counting requirement is fulfilled, to improve counting efficiency, and reduce power consumption of the memory.

In an embodiment, an output signal trimming circuit and/or a signal driver circuit may be further included between an output terminal of the Mth stage of second flip-flop of the second counter circuit and the second counting control circuit. For specific content, refer to related descriptions of the signal trimming circuit and the signal driver circuit in the foregoing part of the embodiments of the present disclosure. Details are not described again.

In an embodiment, an output signal trimming circuit and/or a signal driver circuit may be further included between an output terminal of the Nth stage of third flip-flop of the third counter circuit and the third counting control circuit. In an example, the output signal trimming circuit may be configured to trim the output signal QOUTED_E/O of the Nth stage of third flip-flop based on the first intercepted clock signal (e.g., PCLK_E/O_1 shown in FIG. 8). In addition, the signal driver circuit may enhance a driving capability of the output signal QOUTED_E/O of the Nth stage of third flip-flop. It should be noted that, for other content of the output signal trimming circuit and the signal driver circuit, refer to related descriptions of the signal trimming circuit and the signal driver circuit in the foregoing part of the embodiments of the present disclosure. Details are not described again.

It should be noted that, the counter circuit 23 may alternatively be implemented as another circuit, apparatus, or functional module that can generate the first counting signal X3 and the second counting signal X4. This is not specifically limited.

After the counter circuit 23 is described, the clock signal interception circuit 24 continues to be described below.

The clock signal interception circuit 24 is connected to the command predecoding circuit 21, the command decoding circuit 22, and the counter circuit 23, and is configured to intercept the initial clock signal C0 based on the predecoded command signal X1, the internal command signal X2, the first counting signal X3, and the second counting signal X4, to obtain a target clock signal Cx.

The target clock signal Cx may be a clock signal employed to perform a corresponding function operation of the command X0. For example, the target clock signal Cx may be a clock signal whose cycle is a unit clock cycle and whose cycle quantity is greater than or equal to a quantity of required clock cycles. For example, the WR command is taken as an example, and the target clock signal Cx may be a signal PCLK_WR_E/O shown in FIG. 8.

Figure 13:
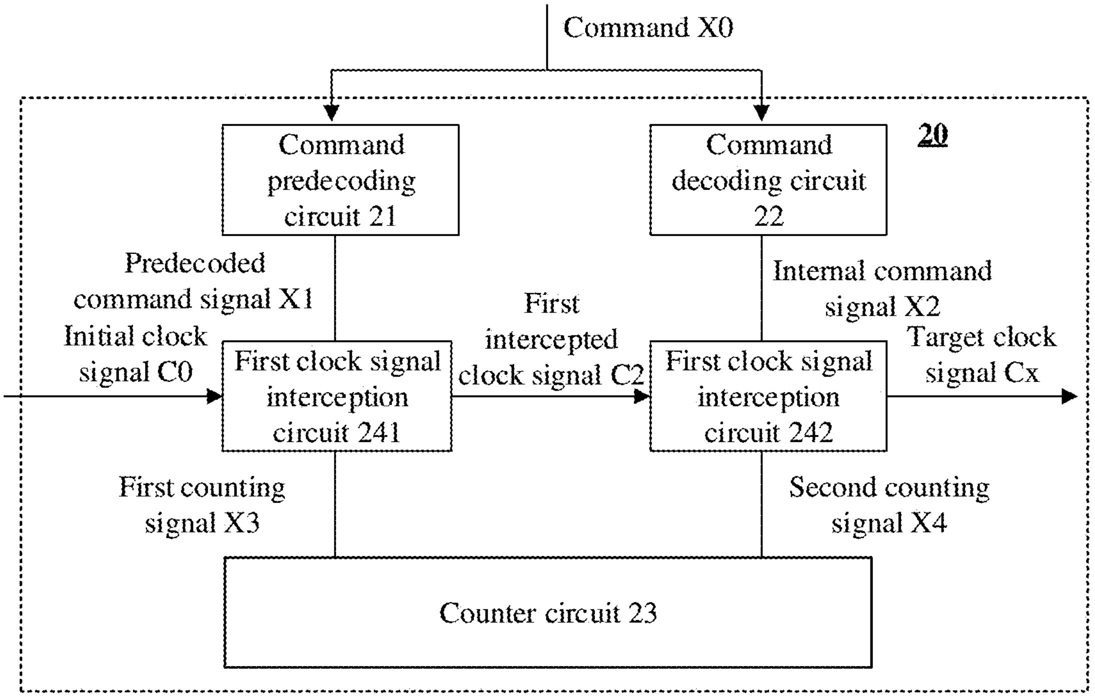
FIG. 13 is a schematic circuit diagram of a clock signal interception circuit according to an embodiment of the present disclosure.

In some embodiments, FIG. 13 is a schematic circuit diagram of a clock signal interception circuit according to an embodiment of the present disclosure. As shown in FIG. 13, the clock signal interception circuit 24 may include a first clock signal interception circuit 241 and a second clock signal interception circuit 242.

The first clock signal interception circuit 241 is connected to the command predecoding circuit 21 and the counter circuit 23, and is configured to intercept at least a part of the initial clock signal C0 (a to-be-intercepted clock signal of the first clock signal interception circuit 241) based on the predecoded command signal X1 and the first counting signal X3, to generate a first intercepted clock signal C2. For example, the first intercepted clock signal C2 may be a clock signal including 2M−1 unit clock cycles. For example, when M is equal to 9, the first intercepted clock signal C2 may be a clock signal with 256 tCK, e.g., PCLK_E/O_1 shown in FIG. 8. Optionally, to improve utilization of the clock signal, a cycle quantity of unit clock cycles of the first intercepted clock signal C2 is greater than or equal to a quantity of clock cycles required by each command. For example, the cycle quantity of unit clock cycles of the first intercepted clock signal C2 may be 256 tCK.

Figure 14:
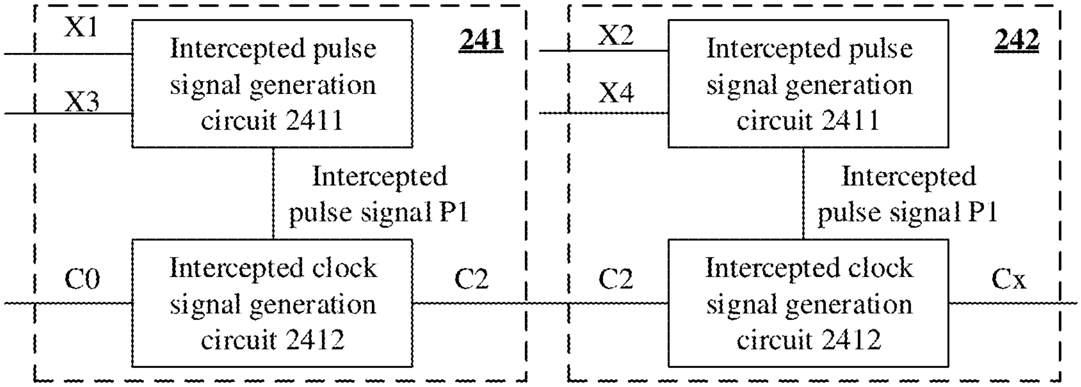
FIG. 14 is a schematic circuit diagram of an example clock signal interception circuit according to an embodiment of the present disclosure.

In an embodiment, FIG. 14 is a schematic circuit diagram of an example clock signal interception circuit according to an embodiment of the present disclosure. As shown in FIG. 14, the first clock signal interception circuit 241 may include an intercepted pulse signal generation circuit 2411 and an intercepted clock signal generation circuit 2412.

The intercepted pulse signal generation circuit 2411 in the first clock signal interception circuit 241 includes a command signal input terminal, a counting signal input terminal, and an intercepted pulse signal output terminal. The command signal input terminal is configured to obtain the predecoded command signal X1, and the counting signal input terminal is configured to obtain the first counting signal X3. The intercepted pulse signal generation circuit 2411 is configured to generate an intercepted pulse signal P1 based on a signal (namely, the predecoded command signal X1) obtained through the command signal input terminal and a signal (namely, the first counting signal X3) obtained through the counting signal input terminal. For example, an active level start moment (a first active signal edge) of the intercepted pulse signal P1 may be generated based on a jump edge of the predecoded command signal X1, and an active level end moment (a second active signal edge) of the intercepted pulse signal P1 may be generated based on a jump edge of the first counting signal. In an example, still as shown in FIG. 8, the intercepted pulse signal net2_1 may be generated based on a predecoded command signal CMD_GATING and a first counting signal Q19B.

Figure 15:
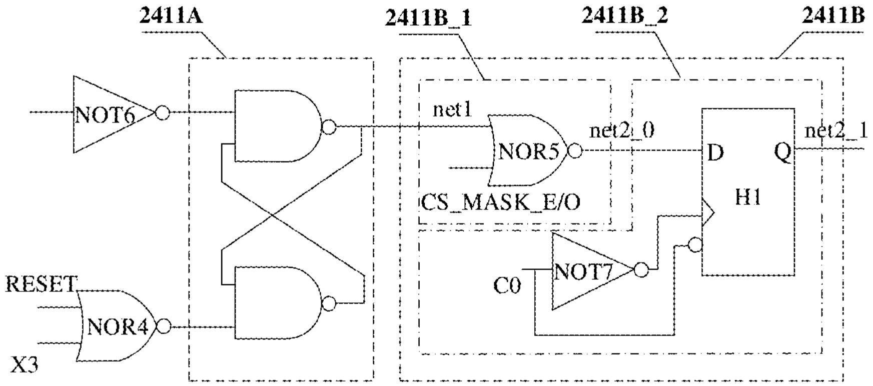
FIG. 15 is a schematic circuit diagram of an intercepted pulse signal generation circuit according to an embodiment of the present disclosure.

In an example, FIG. 15 is a schematic circuit diagram of an intercepted pulse signal generation circuit according to an embodiment of the present disclosure. As shown in FIG. 15, the intercepted pulse signal generation circuit 2411 may include a pulse generation circuit 2411A and a pulse signal adjustment circuit 2411B.

The pulse generation circuit 2411A may be configured to generate a target pulse signal net1 based on the signal (namely, the predecoded command signal X1) obtained through the command signal input terminal of the intercepted pulse signal generation circuit 2411 and the signal (namely, the first counting signal X3) obtained through the counting signal input terminal of the intercepted pulse signal generation circuit.

An active level start moment of the target pulse signal net1 is generated based on a jump edge of the signal (namely, the predecoded command signal X1) obtained through the command signal input terminal of the intercepted pulse signal generation circuit, and an active level end moment of the target pulse signal is generated based on a jump edge of the signal (namely, the first counting signal X3) obtained through the counting signal input terminal of the intercepted pulse signal generation circuit. For example, a first active signal edge of the target pulse signal net1 may be aligned with or have a preset allowable deviation from the jump edge (a rising edge or a falling edge) of the predecoded command signal X1; and a second active signal edge of the target pulse signal net1 may be aligned with or have a preset allowable deviation from the jump edge of the first counting signal. Still as shown in FIG. 8, a rising edge of the target pulse signal net1 is aligned with the predecoded command signal CMD_GATING, and a falling edge of the target pulse signal net1 is aligned with a rising edge of the first counting signal Q19B.

In a specific example, still as shown in FIG. 15, the pulse generation circuit 2411A may include an SR flip-flop. A set terminal of the SR flip-flop is configured to receive an inverted signal of the predecoded command signal (when a triggering edge of the predecoded command signal is a rising edge), and a reset terminal of the SR flip-flop is configured to receive an inverted signal of the first counting signal (when an active level signal of the first counting signal is a low level). In this embodiment, still as shown in FIG. 8, when the predecoded command signal CMD_GATING is pulled up to a high level (namely, the rising edge), the set terminal of the SR flip-flop is set to a low level, so that an output terminal of the SR flip-flop can be pulled up to a high level. In addition, when the first counting signal Q19B is pulled up to a high level, the reset terminal of the SR flip-flop is set to a low level, and in this case, an output terminal of the SR flip-flop may be pulled down to a low level. Therefore, the target pulse signal net1 may be accurately generated through the SR flip-flop. It should be noted that, when the triggering edge of the predecoded command signal is a falling edge, the set terminal of the SR flip-flop is configured to receive an original value signal of the predecoded command signal, and when the active level signal of the first counting signal is a high level, the reset terminal of the SR flip-flop is configured to receive an original value signal of the first counting signal.

Optionally, when the set terminal of the SR flip-flop receives the inverted signal of the predecoded command signal, the pulse generation circuit 2411A may further include a sixth NOT gate NOT6, to receive the predecoded command signal, and invert the predecoded command signal to obtain the inverted signal of the predecoded command signal.

Optionally, when the reset terminal of the SR flip-flop receives the inverted signal of the first counting signal, the pulse generation circuit 2411A may further include a fourth NOR gate NOR4. The fourth NOR gate NOR4 may receive a reset signal RESET and the first counting signal X3, and is configured to output the inverted signal of the first counting signal X3 when the reset signal is at a low level. Still optionally, the reset terminal of the SR flip-flop may be further connected to a singular NOT gate, to provide the inverted signal of the first counting signal X3 to the reset terminal of the SR flip-flop.

It should be noted that the pulse generation circuit 2411A may alternatively be implemented as another circuit, apparatus, or functional module, or the like that can generate the target pulse signal based on the predecoded command signal X1 and the first counting signal X3. This is not specifically limited.

The pulse signal adjustment circuit 2411B may be connected to the pulse generation circuit 2411A, and is configured to: adjust a pulse width of the target pulse signal based on the initial clock signal C0 (the to-be-intercepted clock signal of the first clock signal interception circuit 241). A target pulse signal obtained through width adjustment serves as the intercepted pulse signal.

In an example, the pulse signal adjustment circuit 2411B may include a pulse extender subcircuit 2411B_1 and a pulse adjustment subcircuit 2411B_2.

The pulse extender subcircuit 2411B_1 may be configured to adjust the active level start moment of the target pulse signal forward based on a pulse extension signal (a pulse extension signal CS_MASK_E/O shown in FIG. 15), to generate a target pulse signal obtained after the moment is adjusted forward. The active level start moment of the target pulse signal may be a start moment of a level employed to intercept a clock signal. For example, the pulse extension signal CS_MASK_E/O may be a pulse signal whose duration is 8 tCK, and command/address (C/A) information can be collected within the duration of the pulse extension signal CS_MASK_E/O.

Figure 16:
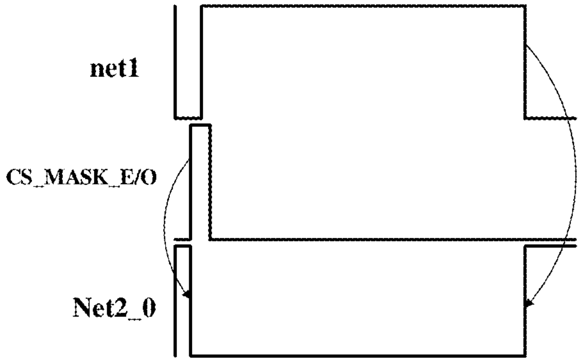
FIG. 16 is a schematic diagram of processing logic of an example target pulse signal according to an embodiment of the present disclosure.

In a specific example, still as shown in FIG. 15, the pulse extender subcircuit 2411B_1 may include a fifth NOR gate NOR5. For example, FIG. 16 is a schematic diagram of processing logic of an example target pulse signal according to an embodiment of the present disclosure. As shown in FIG. 16, the active level start moment of the target pulse signal net1 is adjusted forward through the fifth NOR gate NOR5 based on the pulse extension signal CS_MASK_E/O, to obtain a target pulse signal net2_0 obtained after the moment is adjusted forward.

It should be noted that the pulse extender subcircuit 2411B_1 may alternatively be implemented as another circuit, apparatus, or functional module, or the like that can adjust the active level start moment of the target pulse signal forward based on the pulse extension signal CS_MASK_E/O. This is not specifically limited.

The pulse adjustment subcircuit 2411B_2 is connected to the pulse extender subcircuit 2411B_1, and is configured to adjust, based on the to-be-intercepted clock signal (which is the initial clock signal C0 in the first clock signal interception circuit 241), a pulse width of the target pulse signal obtained after the moment is adjusted forward, to obtain an intercepted pulse signal with a complete cycle.

For example, still as shown in FIG. 15, the pulse adjustment subcircuit 2411B_2 may include a half-latch H1. An input terminal of the half-latch H1 is configured to receive the target pulse signal net2_0 obtained after the moment is adjusted forward. A clock triggering terminal of the half-latch H1 is configured to receive an inverted signal of the to-be-intercepted clock signal (which is the initial clock signal C0 in the first clock signal interception circuit 241). The to-be-intercepted clock signal is inversely connected to the half-latch H1. In other words, the to-be-intercepted clock signal is active and latched at a low level. Subsequently, a NOR operation is performed on an output of the half-latch H1 and the to-be-intercepted clock signal, to ensure that an intercepted signal is a continuous pulse clock signal that starts from a rising edge of a complete cycle after the to-be-intercepted clock signal is initially latched at a low level, to avoid incompleteness of a cycle of the 1st active clock pulse.

It should be noted that the pulse adjustment subcircuit 2411B_2 may alternatively be implemented as another circuit, apparatus, or functional module that can adjust a pulse width of a clock signal. This is not specifically limited.

The pulse extender subcircuit 2411B_1 provided in this example may adjust the active level start moment of the target pulse signal forward, so that the active level start moment of the intercepted pulse signal can be earlier than the earliest operating moment of a command through forward adjustment. In this way, an intercepted target clock signal can completely cover an operation time required by the command, to ensure normal working of the memory. In addition, the pulse adjustment subcircuit 2411B_2 may be employed, to ensure that a cycle of the intercepted target clock signal is complete, and quality of a generated clock signal is improved.

In another example, the pulse signal adjustment circuit 2411B may include one of a pulse extender subcircuit 2411B_1 and a pulse adjustment subcircuit 2411B_2. For example, when the pulse extender subcircuit 2411B_1 is included, a target pulse signal obtained after the moment is adjusted forward may serve as an intercepted pulse signal. For another example, when the pulse adjustment subcircuit 2411B_2 is included, a pulse width of a target pulse signal whose moment is not adjusted forward may be adjusted based on the to-be-intercepted clock signal (which is the initial clock signal C0 in the first clock signal interception circuit 241), to obtain an intercepted pulse signal with a complete cycle. It should be noted that, for specific content, refer to related descriptions in the foregoing part of the embodiments. Details are not described again.

It should be noted that the pulse signal adjustment circuit 2411B may alternatively be implemented as another circuit, apparatus, or functional module, or the like that can adjust the target pulse signal. This is not specifically limited.

In this embodiment, an intercepted pulse signal meeting a requirement can be accurately generated through the pulse generation circuit 2411A and the pulse signal adjustment circuit 2411B, so that the target clock signal can be accurately intercepted, to improve quality of a generated clock signal.

In another example, the intercepted pulse signal generation circuit 2411 may be specifically implemented as the pulse generation circuit 2411A. Correspondingly, the target pulse signal net1 may serve as the intercepted pulse signal. In this instance, the intercepted pulse signal may be quickly generated, to increase a generation speed of the target clock signal. In addition, a circuit structure is simplified, and circuit costs are reduced.

It should be noted that the intercepted pulse signal generation circuit 2411 may alternatively be implemented as another circuit, apparatus, or functional module that can generate the intercepted pulse signal employed to intercept a clock signal. This is not specifically limited.

The intercepted clock signal generation circuit 2412 in the first clock signal interception circuit 241 includes an intercepted pulse signal input terminal, a to-be-intercepted clock signal input terminal, and an intercepted clock signal output terminal. The intercepted pulse signal input terminal is connected to the intercepted pulse signal output terminal. The to-be-intercepted clock signal input terminal is configured to obtain the to-be-intercepted clock signal (which is the initial clock signal C0 in the first clock signal interception circuit 241). The intercepted clock signal generation circuit is configured to: intercept at least a part of the initial clock signal C0 (the to-be-intercepted clock signal of the first clock signal interception circuit 241) based on the intercepted pulse signal P1, to generate the first intercepted clock signal C2, and output the first intercepted clock signal C2 through the intercepted clock signal output terminal.

Figure 17:
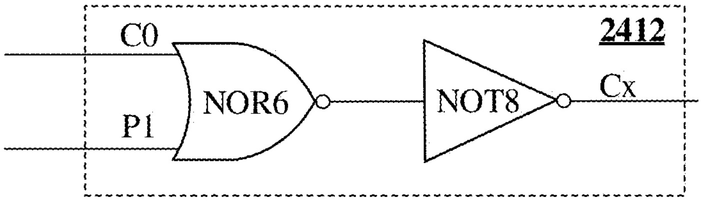
FIG. 17 is a schematic circuit diagram of an example intercepted clock signal generation circuit according to an embodiment of the present disclosure.

In an example, FIG. 17 is a schematic circuit diagram of an example intercepted clock signal generation circuit according to an embodiment of the present disclosure. As shown in FIG. 17, the intercepted clock signal generation circuit 2412 in the first clock signal interception circuit 241 may include a sixth NOR gate NOR6 and an eighth NOT gate NOT8. One terminal of the sixth NOR gate receives an inverted signal of the intercepted pulse signal P1 (when an active level of the intercepted pulse signal P1 is a low level), and the other terminal of the sixth NOR gate receives the initial clock signal C0 (the to-be-intercepted clock signal of the first clock signal interception circuit 241). The eighth NOT gate NOT8 outputs the intercepted clock signal when the inverted signal of the intercepted pulse signal P1 is at a high level. It should be noted that, when the active level of the intercepted pulse signal P1 is a high level, one terminal of the sixth NOR gate of the first clock signal interception circuit receives an original value signal of the intercepted pulse signal P1.

It should be noted that the intercepted clock signal generation circuit 2412 may alternatively be implemented as another circuit, apparatus, or functional module that can have a signal interception function. This is not specifically limited.

The clock signal can be accurately intercepted by the intercepted pulse signal generation circuit 2411 and the intercepted clock signal generation circuit 2412, to improve precision of the target clock signal.

Figure 18:
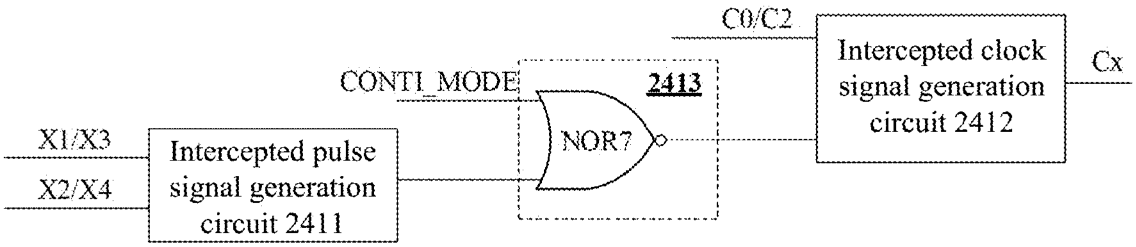
FIG. 18 is a schematic circuit diagram of an example signal shielding circuit according to an embodiment of the present disclosure.

In another embodiment, FIG. 18 is a schematic circuit diagram of an example signal shielding circuit according to an embodiment of the present disclosure. As shown in FIG. 18, the first clock signal interception circuit 241 may further include a signal shielding circuit 2413. An input terminal of the signal shielding circuit 2413 is connected to an output terminal of the intercepted pulse signal generation circuit, and is configured to receive a mode signal CONTI_MODE and the intercepted pulse signal P1. An output terminal of the signal shielding circuit is configured to be connected to an input terminal of the clock signal interception circuit, and is configured to shield or output the intercepted pulse signal based on the mode signal CONTI_MODE. For example, when the mode signal CONTI_MODE is at an active level, the intercepted pulse signal may be shielded. When the mode signal CONTI_MODE is at an inactive level, the inverted signal or the original value signal of the intercepted pulse signal may be output.

In a specific example, still as shown in FIG. 18, the signal shielding circuit 2413 may include a seventh NOR gate NOR7. Correspondingly, the active level of the mode signal CONTI_MODE is a high level, and the inactive level is a low level. For example, when the mode signal CONTI_MODE is at the low level, the inverted signal of the intercepted pulse signal may be output. A clock signal interception process may be effectively controlled through the signal shielding circuit 2414 based on the mode signal CONTI_MODE, to improve control accuracy of the clock signal generation process.

It should be noted that the signal shielding circuit 2413 may alternatively be another circuit, apparatus, or functional module that has a signal shielding function. This is not specifically limited.

After the first clock signal interception circuit 241 is described, the second clock signal interception circuit 242 continues to be described below.

The second clock signal interception circuit 242 is connected to the first clock signal interception circuit 241, the command decoding circuit 22, and the counter circuit 23, and is configured to intercept at least a part of the first intercepted clock signal C2 based on the internal command signal X2 and the second counting signal X4, to generate the target clock signal Cx.

For the target clock signal Cx, in an example, the first intercepted clock signal C2 may be intercepted, to generate the target clock signal Cx. In another example, the initial clock signal C0 may be intercepted, to generate the target clock signal Cx.

In some embodiments, target clock signals Cx of different commands have different quantities of clock cycles. Correspondingly, different commands correspond to different values of N. For example, a target clock signal of a WRA command that requires 168 tCK may include 256 tCK, and correspondingly, N may be 9. For another example, a target clock signal of an MRW command that requires 16 tCK may include 16 tCK or 32 tCK, and correspondingly, N may be 5 or 6.

In an embodiment, the second clock signal interception circuit 242 may include an intercepted pulse signal generation circuit 2411 and an intercepted clock signal generation circuit 2412.

The intercepted pulse signal generation circuit 2411 in the second clock signal interception circuit 242 includes a command signal input terminal, a counting signal input terminal, and an intercepted pulse signal output terminal. The command signal input terminal is configured to obtain the internal command signal X2, and the counting signal input terminal is configured to obtain the second counting signal X4. The intercepted pulse signal generation circuit 2411 is configured to generate an intercepted pulse signal P1 based on a signal (namely, the internal command signal X2) obtained through the command signal input terminal and a signal (namely, the second counting signal X4) obtained through the counting signal input terminal.

The intercepted clock signal generation circuit 2412 in the second clock signal interception circuit 242 includes an intercepted pulse signal input terminal, a to-be-intercepted clock signal input terminal, and an intercepted clock signal output terminal. The intercepted pulse signal input terminal is connected to the intercepted pulse signal output terminal. The to-be-intercepted clock signal input terminal is configured to obtain the first intercepted clock signal C2 (or may obtain the initial clock signal C0). The intercepted clock signal generation circuit is configured to: intercept, based on the intercepted pulse signal P1, at least a part of the first intercepted clock signal C2 obtained through the to-be-intercepted clock signal input terminal (or may obtain the initial clock signal C0), to generate the target clock signal Cx, and output the target clock signal Cx through the intercepted clock signal output terminal. It should be noted that, for specific content of the intercepted pulse signal generation circuit 2411 and the intercepted clock signal generation circuit 2412, refer to related descriptions in the foregoing part of the embodiments of the present disclosure. Details are not described again.

Through the first clock signal interception circuit 241 and the second clock signal interception circuit 242 in this embodiment of the present disclosure, the target clock signal may be further intercepted based on the second counting signal X4 and the first intercepted clock signal intercepted based on the first counting signal X3, to further reduce a clock of an unnecessary cycle in the target clock signal. In this way, a dynamic loss of the memory caused by continuous flipping of the clock of the unnecessary cycle generated due to mismatching between the clock cycle and the command during operation of the command is avoided, thereby reducing the dynamic loss of the memory. It should be noted that the clock signal interception circuit in this embodiment of the present disclosure may alternatively be implemented as another circuit, apparatus, or functional module that can intercept the target clock signal. Details are not described herein again.

In some embodiments, the clock signal generation circuit further includes a set signal generation circuit 25.

Figure 19:
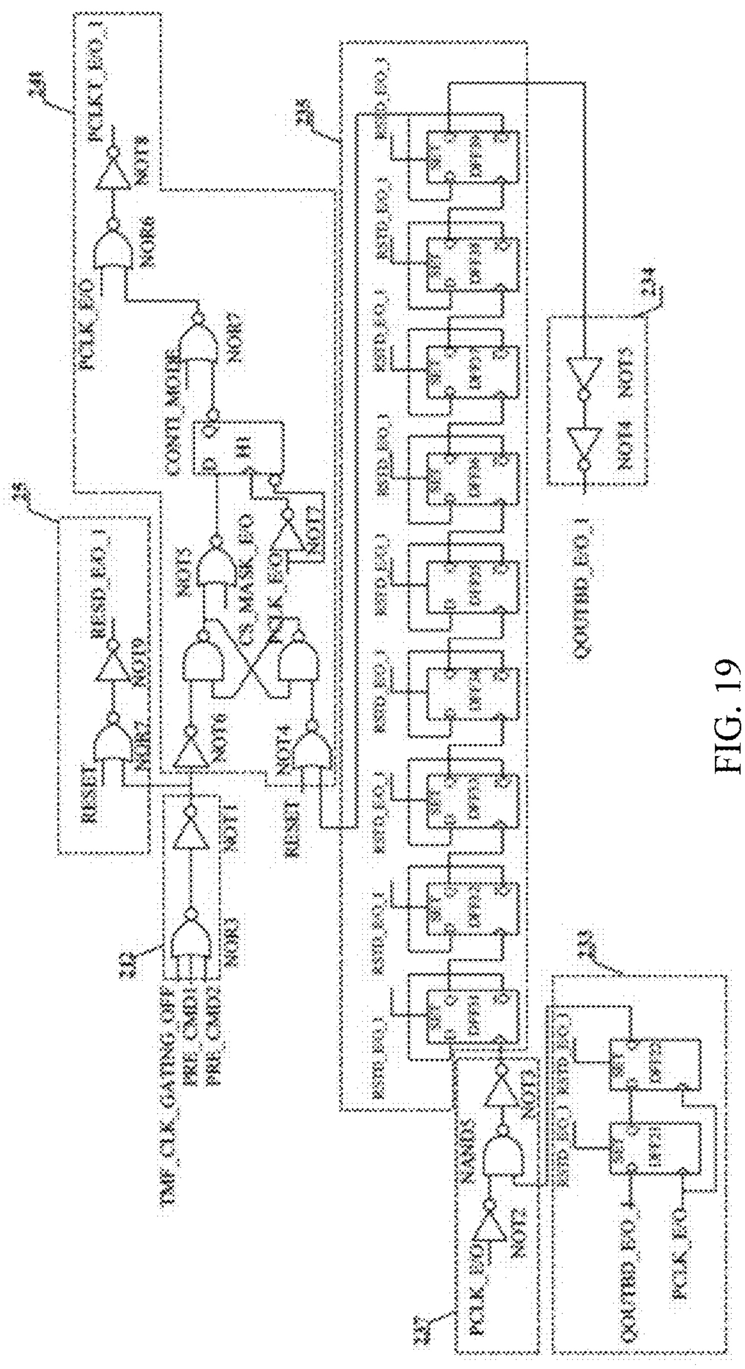
FIG. 19 is a schematic diagram of a first partial circuit in a clock signal generation circuit according to an embodiment of the present disclosure.

When the set signal generation circuit 25 is configured to set the second flip-flop of the second counter circuit, the set signal generation circuit 25 is configured to generate a set signal of the second flip-flop based on the predecoded command signal and the reset signal RESET. For example, FIG. 19 is a schematic diagram of a first partial circuit in a clock signal generation circuit according to an embodiment of the present disclosure. As shown in FIG. 19, the set signal generation circuit 25 may include a seventh NOR gate NOR7 and a ninth NOT gate NOT9, to generate a set signal RESD_E/O_1 of the second flip-flop.

Figure 20:
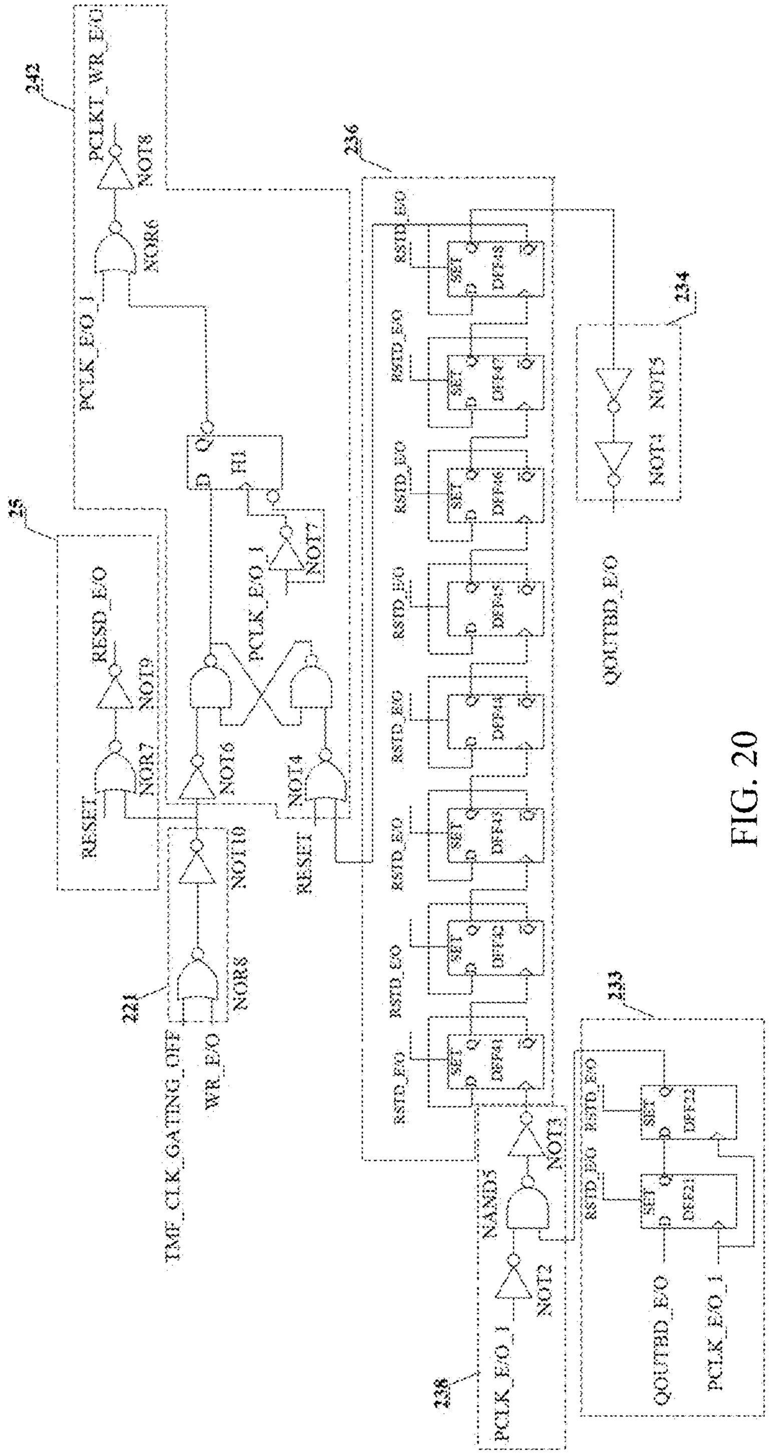
FIG. 20 is a schematic diagram of a second partial circuit in a clock signal generation circuit according to an embodiment of the present disclosure.

When the set signal generation circuit 25 is configured to set the third flip-flop of the third counter circuit, the set signal generation circuit 25 is configured to generate a set signal of the third flip-flop based on the internal command signal and the reset signal RESET. For example, FIG. 20 is a schematic diagram of a second partial circuit in a clock signal generation circuit according to an embodiment of the present disclosure. As shown in FIG. 20, the set signal generation circuit 25 may generate a set signal RESD_E/O of the third flip-flop based on the internal command signal.

According to the clock signal generation circuit provided in this embodiment of the present disclosure, after the predecoding command is obtained by decoding partial command bits in the command based on the command predecoding circuit, the internal command signal is obtained through decoding based on the command decoding circuit, and the first counting signal and the second counting signal are generated by counting the clock cycle for the initial clock signal by the counter circuit, because the predecoded command signal and the internal command signal are related to the command, and because the first counting signal and the second counting signal are obtained by performing counting for the initial clock signal, a part of the initial clock signal may be intercepted based on the predecoded command signal, the internal command signal, a counting result of the first counting signal, and a counting result of the second counting signal, to obtain the target clock signal matching the command. A target clock signal of each command can match each command. Compared with a technical solution in which the same clock signal is employed for each command, in this embodiment of the present disclosure, a dynamic loss of the memory caused by continuous flipping of a clock of an unnecessary cycle generated due to mismatching between the clock cycle and the command during operation of the command is avoided, thereby reducing the dynamic loss of the memory.

In some embodiments, as shown in both FIG. 19 and FIG. 20, the WR command is taken as an example, and the first partial circuit is configured to generate a first intercepted clock signal PCLK_E/O_1 based on the initial clock signal PCLK_E/O. The second counting control circuit 237 is connected to the second counter circuit 235. The second partial circuit is configured to generate a target clock signal PCLK_WR_E/O based on the first intercepted clock signal PCLK_E/O_1. The third counting control circuit 238 is connected to the third counter circuit 236. For each component circuit of the first partial circuit and the second partial circuit, refer to related descriptions in the foregoing part of the embodiments of the present disclosure. Details are not described again.

In addition, it should be noted that FIG. 19 and FIG. 20 are schematic circuit diagrams in a case in which the first counting signal and the second counting signal are generated by different counter circuits. When the first counting signal and the second counting signal are generated by the same counter circuit, the second partial circuit may not include the third counter circuit 236, the third counting control circuit 238 connected to the third counter circuit 236, the output signal trimming circuit 233, and the signal driver circuit 234. Correspondingly, the second counting signal may be provided by the second counter circuit 235 to the second clock signal interception circuit 242.

In an embodiment, the command decoding circuit may further include a decoding control circuit 221. The decoding control circuit 221 may further receive a decoding control signal. The decoding control signal is employed to indicate to enable or disable decoding. In addition, the internal command signal is provided to the clock signal interception circuit when the decoding control signal indicates to enable decoding. For example, the decoding control signal may be the same as the predecoding control signal, for example, is also the control signal TMF_CLK_GATING_OFF.

In an example, still as shown in FIG. 20, the decoding control circuit 221 may include an eighth NOR gate NOR8 and a tenth NOT gate NOT10. A first input terminal of the eighth NOR gate NOR8 is configured to receive the decoding control signal, and a second input terminal of the eighth NOR gate NOR8 is configured to receive an internal command signal WR_E/O. An output terminal of the eighth NOR gate NOR8 is connected to an input terminal of the tenth NOT gate NOT10.

Based on the same inventive concept, an embodiment of the present disclosure further provides a clock signal generation method, as shown in the following embodiment.

Figure 21:
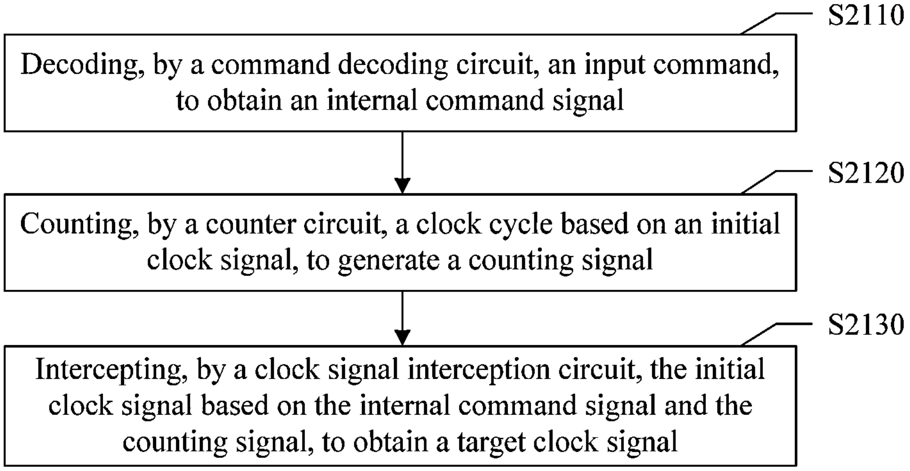
FIG. 21 is a schematic flowchart of a clock signal generation method according to an embodiment of the present disclosure.

FIG. 21 is a schematic flowchart of a clock signal generation method according to an embodiment of the present disclosure. As shown in FIG. 21, the clock signal generation method includes S2110 to S2130.

In the step of S2110, a command decoding circuit decodes an input command, to obtain an internal command signal.

In the step of S2120, a counter circuit counts a clock cycle based on an initial clock signal, to generate a counting signal.

In the step of S2130, a clock signal interception circuit intercepts the initial clock signal based on the internal command signal and the counting signal, to obtain a target clock signal.

In some embodiments, before step S2110, the clock signal generation method may further include step D1. In the step of D1, a command predecoding circuit decodes partial command bits in a command, to obtain a predecoded command signal.

In an embodiment, step D1 includes step D11 and step D12.

In the step of D11, each command predecoding subcircuit predecodes the command, to obtain one predecoded command subsignal.

In the step of D12, a predecoded command subsignal processing circuit combines multiple predecoded command subsignals, to generate the predecoded command signal.

In some embodiments, S2120 may specifically include the step as follows: The counter circuit counts the clock cycle based on the initial clock signal, to generate a first counting signal and a second counting signal. Correspondingly, S2130 may specifically include the step as follows: The initial clock signal is intercepted based on the predecoded command signal, the internal command signal, the first counting signal, and the second counting signal, to obtain the target clock signal.

In some embodiments, S2130 includes step D21 and step D22.

In the step of D21, a first clock signal interception circuit intercepts at least a part of the initial clock signal based on the predecoded command signal and the first counting signal, to generate a first intercepted clock signal.

In the step of D22, a second clock signal interception circuit intercepts at least a part of the first intercepted clock signal based on the internal command signal and the second counting signal, to generate the target clock signal.

In some embodiments, step D21 includes step D211 to step D213.

In the step of D211, an intercepted pulse signal generation circuit obtains the predecoded command signal and the first counting signal.

In the step of D212, the intercepted pulse signal generation circuit generates an intercepted pulse signal based on the predecoded command signal and the first counting signal.

In the step of D213, an intercepted clock signal generation circuit obtains the initial clock signal, intercepts at least a part of the initial clock signal based on the intercepted pulse signal, to generate the first intercepted clock signal, and outputs the first intercepted clock signal through an intercepted clock signal output terminal.

In an embodiment, step D212 includes step D2121 and step D2122.

In the step of D2121, the pulse generation circuit generates a target pulse signal based on the predecoded command signal and the first counting signal.

In the step of D2122, a pulse signal adjustment circuit adjusts a pulse width of the target pulse signal based on the initial clock signal. A target pulse signal obtained through width adjustment serves as the intercepted pulse signal.

In an example, step D2122 includes the step as follows: A pulse extender subcircuit adjusts an active level start moment of the target pulse signal forward based on the pulse extension signal, to generate a target pulse signal obtained after the moment is adjusted forward. A pulse adjustment subcircuit adjusts, based on the initial clock signal, a pulse width of the target pulse signal obtained after the moment is adjusted forward, to obtain an intercepted pulse signal with a complete cycle.

In an embodiment, step D214 is further included between step D212 and step D213.

In the step of D214, a signal shielding circuit receives a mode signal and the intercepted pulse signal, to shield or output the intercepted pulse signal to the clock signal interception circuit based on the mode signal.

In some embodiments, step D22 includes step D221 to step D223.

In the step of D221, an intercepted pulse signal generation circuit obtains the internal command signal and the second counting signal.

In the step of D222, the intercepted pulse signal generation circuit generates the intercepted pulse signal based on the internal command signal and the second counting signal.

In the step of D223, the intercepted clock signal generation circuit obtains the first intercepted clock signal (or the initial clock signal), intercepts at least a part of the first intercepted clock signal (or the initial clock signal) based on the intercepted pulse signal, generates the target clock signal, and outputs the target clock signal through the intercepted clock signal output terminal.

In an embodiment, step D222 includes step D2221 and step D2222.

In the step of D2221, the pulse generation circuit generates the target pulse signal based on the internal command signal and the second counting signal.

In the step of D2222, the pulse signal adjustment circuit adjusts the pulse width of the target pulse signal based on the first intercepted clock signal (or the initial clock signal). A target pulse signal obtained through width adjustment serves as the intercepted pulse signal.

In an example, step D2222 includes the step as follows: The pulse extender subcircuit adjusts the active level start moment of the target pulse signal forward based on the pulse extension signal, to generate the target pulse signal obtained after the moment is adjusted forward. The pulse adjustment subcircuit adjusts, based on the first intercepted clock signal (or the initial clock signal), the pulse width of the target pulse signal obtained after the moment is adjusted forward, to obtain the intercepted pulse signal with a complete cycle.

In an embodiment, step D224 is further included between step D222 and step D223. In the step of D224, the signal shielding circuit receives the mode signal and the intercepted pulse signal, to shield or output the intercepted pulse signal to the clock signal interception circuit based on the mode signal.

In some embodiments, S2130 includes step D23. In the step of D23, the first clock signal interception circuit intercepts at least a part of the initial clock signal based on the predecoded command signal and the first counting signal, to obtain the target clock signal.

In some embodiments, when the counter circuit includes a first counter circuit, the clock signal generation method further includes step D31. In the step of D31, the first counting control circuit receives the initial clock signal and an output signal of the Mth stage of first flip-flop, and when the output signal of the Mth stage of first flip-flop is at a first level, starts the first counter circuit to perform counting based on the initial clock signal; and when the output signal of the Mth stage of first flip-flop is at a second level, controls the first counter circuit to stop counting.

In some embodiments, when the counter circuit includes a second counter circuit, the clock signal generation method further includes step D32. In the step of D32, the second counting control circuit receives the initial clock signal and an output signal of the Mth stage of second flip-flop, and when the output signal of the Mth stage of second flip-flop is at the first level, starts the second counter circuit to perform counting based on the initial clock signal;

and when the output signal of the Mth stage of second flip-flop is at the second level, controls the second counter circuit to stop counting.

In some embodiments, when the counter circuit includes a third counter circuit, the clock signal generation method further includes step D33. In the step of D33, the third counting control circuit receives the first intercepted clock signal and an output signal of the Nth stage of third flip-flop, and when the output signal of the Nth stage of third flip-flop is at the first level, starts the output signal of the Nth stage of third flip-flop to perform counting based on the first intercepted clock signal; and when the output signal of the Nth stage of third flip-flop is at the second level, controls the second counter circuit to stop counting.

It should be noted that the clock signal generation method shown in FIG. 21 may be implemented through the embodiments in the apparatus embodiments shown in FIG. 4 to FIG. 20, and various effects in the apparatus embodiments shown in FIG. 4 to FIG. 20 are achieved. Details are not described herein again.

According to the clock signal generation method provided in this embodiment of the present disclosure, after the predecoding command is obtained by decoding partial command bits in the command based on the command predecoding circuit, the internal command signal is obtained through decoding based on the command decoding circuit, and the first counting signal and the second counting signal are generated by counting the clock cycle for the initial clock signal by the counter circuit, because the predecoded command signal and the internal command signal are related to the command, and because the first counting signal and the second counting signal are obtained by performing counting for the initial clock signal, a part of the initial clock signal may be intercepted based on the predecoded command signal, the internal command signal, a counting result of the first counting signal, and a counting result of the second counting signal, to obtain the target clock signal matching the command. A target clock signal of each command can match an operation time of each command. Compared with a technical solution in which the same clock signal is employed for each command, in this embodiment of the present disclosure, a dynamic loss of the memory caused by continuous flipping of a clock of an unnecessary cycle generated due to mismatching between the clock cycle and the command during operation of the command is avoided, thereby reducing the dynamic loss of the memory.

Based on the same inventive concept, an embodiment of the present disclosure further provides another clock signal generation method, as shown in the following embodiment.

Figure 22:
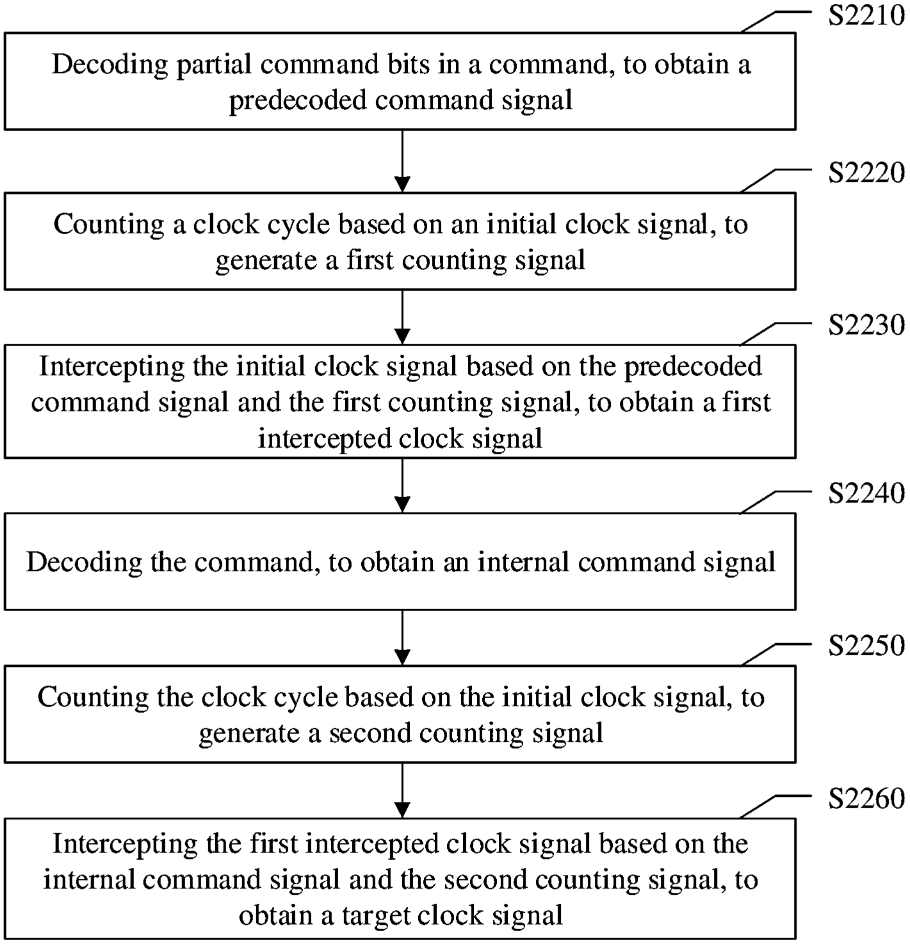
FIG. 22 is a schematic flowchart of another clock signal generation method according to an embodiment of the present disclosure.

FIG. 22 is a schematic flowchart of another clock signal generation method according to an embodiment of the present disclosure. As shown in FIG. 22, the clock signal generation method includes S2210 to S2260.

In the step of S2210, partial command bits in a command are decoded, to obtain a predecoded command signal. It should be noted that S2210 may be implemented by the foregoing command decoding circuit. For specific content of S2210, refer to related descriptions of the command decoding circuit in the foregoing part of the embodiments of the present disclosure. Details are not described again.

In the step of S2220, a clock cycle is counted based on an initial clock signal, to generate a first counting signal. It should be noted that S2220 may be implemented by the foregoing first counter circuit or the foregoing second counter circuit. For specific content of S2220, refer to related descriptions of the foregoing first counter circuit and the foregoing second counter circuit in the foregoing part of the embodiments of the present disclosure. Details are not described again.

In the step of S2230, the initial clock signal is intercepted based on the predecoded command signal and the first counting signal, to obtain a first intercepted clock signal. It should be noted that S2230 may be implemented by the first clock signal interception circuit. For specific content of S2230, refer to related descriptions of the first clock signal interception circuit in the foregoing part of the embodiments of the present disclosure. Details are not described again.

In the step of S2240, the command is decoded, to obtain an internal command signal. It should be noted that S2240 may be implemented by the foregoing command decoding circuit. For specific content of S2240, refer to related descriptions of the command decoding circuit in the foregoing part of the embodiments of the present disclosure. Details are not described again.

In the step of S2250, the clock cycle is counted based on the initial clock signal, to generate a second counting signal. It should be noted that S2250 may be implemented by the foregoing first counter circuit or the foregoing third counter circuit. For specific content of S2250, refer to related descriptions of the foregoing first counter circuit and the foregoing third counter circuit in the foregoing part of the embodiments of the present disclosure. Details are not described again.

In the step of S2260, the first intercepted clock signal is intercepted based on the internal command signal and the second counting signal, to obtain a target clock signal. It should be noted that S2260 may be implemented by the second clock signal interception circuit. For specific content of S2260, refer to related descriptions of the second clock signal interception circuit in the foregoing part of the embodiments of the present disclosure. Details are not described again.

According to the clock signal generation method provided in this embodiment of the present disclosure, after the predecoding command is obtained by decoding partial command bits in the command based on the command predecoding circuit, the internal command signal is obtained through decoding based on the command decoding circuit, and the first counting signal and the second counting signal are generated by counting the clock cycle for the initial clock signal by the counter circuit, because the predecoded command signal and the internal command signal are related to the command, and because the first counting signal and the second counting signal are obtained by performing counting for the initial clock signal, a part of the initial clock signal may be intercepted based on the predecoded command signal, the internal command signal, a counting result of the first counting signal, and a counting result of the second counting signal, to obtain the target clock signal matching the command. A target clock signal of each command can match an operation time of each command. Compared with a technical solution in which the same clock signal is employed for each command, in this embodiment of the present disclosure, a dynamic loss of the memory caused by continuous flipping of a clock of an unnecessary cycle generated due to mismatching between the clock cycle and the command during operation of the command is avoided, thereby reducing the dynamic loss of the memory.

Based on the same inventive concept, an embodiment of the present disclosure further provides a semiconductor memory. The semiconductor memory may include a storage module and a clock signal generation circuit. The storage module may include multiple memory arrays (banks). In addition, the clock signal generation circuit is the clock signal generation circuit 20 provided in any one of the foregoing embodiments of the present disclosure. For specific content of the clock signal generation circuit 20, refer to related descriptions in the foregoing part of the embodiments of the present disclosure with reference to FIG. 4 to FIG. 8. Details are not described again. For specific content of the semiconductor memory, refer to related descriptions in the foregoing part of the embodiments of the present disclosure. Details are not described again.

According to the semiconductor memory provided in this embodiment of the present disclosure, after a predecoding command is obtained by decoding partial command bits in a command based on a command predecoding circuit, an internal command signal is obtained through decoding based on the command decoding circuit, and a first counting signal and a second counting signal are generated by counting a clock cycle for an initial clock signal by a counter circuit, because a predecoded command signal and the internal command signal are related to the command, and because the first counting signal and the second counting signal are obtained by performing counting for the initial clock signal, a part of the initial clock signal may be intercepted based on the predecoded command signal, the internal command signal, a counting result of the first counting signal, and a counting result of the second counting signal, to obtain a target clock signal matching the command. A target clock signal of each command can match an operation time of each command. Compared with a technical solution in which the same clock signal is employed for each command, in this embodiment of the present disclosure, a dynamic loss of the memory caused by continuous flipping of a clock of an unnecessary cycle generated due to mismatching between the clock cycle and the command during operation of the command is avoided, thereby reducing a dynamic loss of the semiconductor memory.

Based on the same inventive concept, an embodiment of the present disclosure further provides an electronic device. The electronic device may include the memory provided in any one of the foregoing embodiments of the present disclosure. For specific content of the memory, refer to related descriptions in the foregoing part of the embodiments of the present disclosure. Details are not described again. The electronic device in this embodiment of the present disclosure may be an electronic device equipped with a memory. For example, the electronic device may be a mobile terminal, a computer, a server, a virtual reality device, or an internet of things device.

According to the electronic device provided in this embodiment of the present disclosure, after a predecoding command is obtained by decoding partial command bits in a command based on a command predecoding circuit, an internal command signal is obtained through decoding based on the command decoding circuit, and a first counting signal and a second counting signal are generated by counting a clock cycle for an initial clock signal by a counter circuit, because a predecoded command signal and the internal command signal are related to the command, and because the first counting signal and the second counting signal are obtained by performing counting for the initial clock signal, a part of the initial clock signal may be intercepted based on the predecoded command signal, the internal command signal, a counting result of the first counting signal, and a counting result of the second counting signal, to obtain a target clock signal matching the command. A target clock signal of each command can match an operation time of each command. Compared with a technical solution in which the same clock signal is employed for each command, in this embodiment of the present disclosure, a dynamic loss of the memory caused by continuous flipping of a clock of an unnecessary cycle generated due to mismatching between the clock cycle and the command during operation of the command is avoided, thereby reducing the dynamic loss of the memory.

It should be noted that the embodiments in this specification are described in a progressive manner. For the same or similar part of the embodiments, mutual reference may be made to the embodiments. Each embodiment focuses on a difference from another embodiment. Description of the method embodiment is relatively simple. For related parts, refer to the description part of the system embodiment. The present disclosure is not limited to the specific steps and structures described above and shown in the figures. A person skilled in the art may make various changes, modifications, and additions, or change a sequence of steps after understanding the spirit of the present disclosure. In addition, for brevity, detailed descriptions of a known method technology are omitted herein.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure.

Therefore, the protection scope of the present disclosure shall be subject to the protection scope of the claims. The present disclosure is intended to cover any variations, functions, or adaptive changes of the present disclosure. These variations, functions, or adaptive changes comply with general principles of the present disclosure, and include common knowledge or a conventional technical means in the technical field that is not disclosed in the present disclosure. The specification and embodiments are merely considered as examples, and the true scope and spirit of the present disclosure are pointed out in the appended claims.

What is claimed is:

1. A clock signal generation circuit, the clock signal generation circuit comprising:

a command predecoding circuit, configured to decode partial command bits in a command, to obtain a predecoded command signal;

a command decoding circuit, configured to decode the command, to obtain an internal command signal;

a counter circuit, configured to count a clock cycle based on an initial clock signal, to generate a first counting signal and a second counting signal; and a clock signal interception circuit, connected to the command predecoding circuit, the command decoding circuit, and the counter circuit, and configured to intercept the initial clock signal based on the predecoded command signal, the internal command signal, the first counting signal, and the second counting signal, to obtain a target clock signal.

2. The clock signal generation circuit according to claim 1, wherein the counter circuit comprises:

a first counter circuit, comprising M stages of first flip-flops, an output signal of an ith stage of first flip-flop flipping once on a $(p\times2^{i-1}+1)$th triggering edge of the initial clock signal, i being any positive integer less than or equal to M, and p being any positive integer;

an output signal of an Mth stage of first flip-flop being the first counting signal, an output signal of an Nth stage of first flip-flop being the second counting signal, M and N being integers greater than or equal to 1, and M being greater than or equal to N; and both $2^{M-1}$ and $2^{N-1}$ being greater than or equal to a quantity of clock cycles required by the command.

3. The clock signal generation circuit according to claim 2, wherein the clock signal interception circuit comprises a first clock signal interception circuit and a second clock signal interception circuit;

the first clock signal interception circuit is connected to the command predecoding circuit and the counter circuit, and is configured to intercept at least a part of the initial clock signal based on the predecoded command signal and the first counting signal, to generate a first intercepted clock signal; and the second clock signal interception circuit is connected to the first clock signal interception circuit, the command decoding circuit, and the counter circuit, and is configured to intercept at least a part of the first intercepted clock signal based on the internal command signal and the second counting signal, to generate the target clock signal.

4. The clock signal generation circuit according to claim 3, wherein the first clock signal interception circuit and/or the second clock signal interception circuit comprise/comprises an intercepted pulse signal generation circuit and an intercepted clock signal generation circuit;

the intercepted pulse signal generation circuit comprises a command signal input terminal, a counting signal input terminal, and an intercepted pulse signal output terminal, the command signal input terminal is configured to obtain the predecoded command signal or the internal command signal, the counting signal input terminal is configured to obtain the first counting signal or the second counting signal, and the intercepted pulse signal generation circuit is configured to generate an intercepted pulse signal based on a signal obtained through the command signal input terminal and a signal obtained through the counting signal input terminal; and the intercepted clock signal generation circuit comprises an intercepted pulse signal input terminal, a to-be-intercepted clock signal input terminal, and an intercepted clock signal output terminal, the intercepted pulse signal input terminal is connected to the intercepted pulse signal output terminal, the to-be-intercepted clock signal input terminal is configured to obtain the initial clock signal or the first intercepted clock signal, and the intercepted clock signal generation circuit is configured to: intercept, based on the intercepted pulse signal, at least a part of the signal obtained through the to-be-intercepted clock signal input terminal, generate the first intercepted clock signal or the target clock signal, and output the first intercepted clock signal or the target clock signal through the intercepted clock signal output terminal.

5. The clock signal generation circuit according to claim 4, wherein the intercepted pulse signal generation circuit comprises:

a pulse generation circuit, configured to generate a target pulse signal based on the signal obtained through the command signal input terminal of the intercepted pulse signal generation circuit and the signal obtained through the counting signal input terminal of the intercepted pulse signal generation circuit, an active level start moment of the target pulse signal being generated based on a jump edge of the signal obtained through the command signal input terminal of the intercepted pulse signal generation circuit, and an active level end moment of the target pulse signal being generated based on a jump edge of the signal obtained through the counting signal input terminal of the intercepted pulse signal generation circuit; and a pulse signal adjustment circuit, connected to the pulse generation circuit, and configured to adjust a pulse width of the target pulse signal based on the signal obtained through the to-be-intercepted clock signal input terminal, the target pulse signal obtained through width adjustment serving as the intercepted pulse signal.

6. The clock signal generation circuit according to claim 5, wherein the pulse signal adjustment circuit comprises:

a pulse extender subcircuit, configured to adjust the active level start moment of the target pulse signal forward based on a pulse extension signal, to generate the target pulse signal obtained after the moment is adjusted forward; and a pulse adjustment subcircuit, connected to the pulse extender subcircuit, and configured to adjust, based on the signal obtained through the to-be-intercepted clock signal input terminal, a pulse width of the target pulse signal obtained after the moment is adjusted forward, to obtain the intercepted pulse signal with a complete cycle.

7. The clock signal generation circuit according to claim 4, wherein either of the first clock signal interception circuit and the second clock signal interception circuit comprises:

a signal shielding circuit, an input terminal of the signal shielding circuit being connected to an output terminal of the intercepted pulse signal generation circuit, and being configured to receive a mode signal and the intercepted pulse signal, and an output terminal of the signal shielding circuit being configured to be connected to an input terminal of the clock signal interception circuit, and being configured to shield or output the intercepted pulse signal based on the mode signal.

8. The clock signal generation circuit according to claim 2, wherein the counter circuit further comprises:

a first counting control circuit, connected to the first counter circuit, configured to receive the initial clock signal and the output signal of the Mth stage of first flip-flop, and configured to: when the output signal of the Mth stage of first flip-flop is at a first level, start the first counter circuit to perform counting based on the initial clock signal; and when the output signal of the Mth stage of first flip-flop is at a second level, control the first counter circuit to stop counting.

9. The clock signal generation circuit according to claim 8, wherein the first counting control circuit comprises a second NOT gate, a fifth NAND gate, and a third NOT gate; and the second NOT gate is configured to invert the initial clock signal, to obtain an inverted signal of the initial clock signal, one terminal of the fifth NAND gate receives the inverted signal of the initial clock signal, and the other terminal of the fifth NAND gate receives the output signal of the Mth stage of first flip-flop, and is configured to input the inverted signal of the initial clock signal into a clock input terminal of a 1st stage of first flip-flop when the output signal of the Mth stage of first flip-flop is at a high level.

10. The clock signal generation circuit according to claim 1, wherein the counter circuit comprises:

a second counter circuit, comprising M stages of second flip-flops, an output signal of a jth stage of second flip-flop flipping once on the $(p\times2^{j-1}+1)$th triggering edge of the initial clock signal, an output signal of an Mth stage of second flip-flop being the first counting signal, j being any positive integer less than or equal to M, and p being any positive integer; and a third counter circuit, comprising N stages of third flip-flops, an output signal of a kth stage of third flip-flop flipping once on the $(p\times2^{k-1}+1)$th triggering edge of the initial clock signal, an output signal of an Nth stage of third flip-flopbeing the second counting signal, k being any positive integer less than or equal to N, M and N being integers greater than or equal to 1, and N being less than or equal to M; and both $2^{M-1}$ and $2^{N-1}$ being greater than or equal to a quantity of clock cycles required by the command.

11. The clock signal generation circuit according to claim 10, wherein the counter circuit further comprises a second counting control circuit and/or a third counting control circuit;

the second counting control circuit is connected to the second counter circuit, is configured to receive the initial clock signal and the output signal of the Mth stage of second flip-flop, and is configured to: when the output signal of the Mth stage of second flip-flop is at the first level, start the second counter circuit to perform counting based on the initial clock signal; and when the output signal of the Mth stage of second flip-flop is at the second level, control the second counter circuit to stop counting; and the third counting control circuit is connected to the third counter circuit, is configured to receive the first intercepted clock signal and the output signal of the Nth stage of third flip-flop, and is configured to: when the output signal of the Nth stage of third flip-flop is at the first level, start the output signal of the Nth stage of third flip-flop to perform counting based on the first intercepted clock signal; and when the output signal of the Nth stage of third flip-flop is at the second level, control the second counter circuit to stop counting.

12. The clock signal generation circuit according to claim 1, wherein the command predecoding circuit comprises:

a plurality of command predecoding subcircuits, different command predecoding subcircuits decoding different quantities of command bits/command bits at different locations, and each command predecoding subcircuit being configured to predecode the command, to obtain a predecoded command subsignal; and a predecoded command subsignal processing circuit, connected to the plurality of command predecoding subcircuits, and configured to combine a plurality of predecoded command subsignals, to generate the predecoded command signal.

13. A memory, comprising the clock signal generation circuit according to claim 1.

14. A clock signal generation method, comprising:

decoding, by a command predecoding circuit, partial command bits in a command, to obtain a predecoded command signal;

decoding, by a command decoding circuit, the command, to obtain an internal command signal;

counting, by a counter circuit, a clock cycle based on an initial clock signal, to generate a counting signal; and intercepting, by a clock signal interception circuit, the initial clock signal based on the internal command signal and the counting signal, to obtain a target clock signal.

15. A clock signal generation method, comprising:

decoding partial command bits in a command, to obtain a predecoded command signal;

counting a clock cycle based on an initial clock signal, to generate a first counting signal;

intercepting the initial clock signal based on the predecoded command signal and the first counting signal, to obtain a first intercepted clock signal;

decoding the command, to obtain an internal command signal;

counting the clock cycle based on the initial clock signal, to generate a second counting signal; and intercepting the first intercepted clock signal based on the internal command signal and the second counting signal, to obtain a target clock signal.

* * * * *